(12) United States Patent
Chen et al.

(10) Patent No.: US 12,052,934 B2
(45) Date of Patent: Jul. 30, 2024

(54) MEMORY STRUCTURE AND FORMATION METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Wei-Jen Chen, Tainan (TW); Ya-Jui Tsou, Taichung (TW); Chee-Wee Liu, Taipei (TW); Shao-Yu Lin, Taichung (TW); Chih-Lin Wang, Hsinchu County (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 157 days.

(21) Appl. No.: 17/668,514

(22) Filed: Feb. 10, 2022

(65) Prior Publication Data
US 2023/0255122 A1 Aug. 10, 2023

(51) Int. Cl.
*H10N 52/80* (2023.01)
*H10B 61/00* (2023.01)
*H10N 52/00* (2023.01)
*H10N 52/01* (2023.01)

(52) U.S. Cl.
CPC ............. *H10N 52/80* (2023.02); *H10B 61/00* (2023.02); *H10N 52/00* (2023.02); *H10N 52/01* (2023.02)

(58) Field of Classification Search
CPC ........ H10N 52/80; H10N 52/01; H10N 52/00; H10B 61/00
See application file for complete search history.

(56) References Cited

U.S. PATENT DOCUMENTS

2019/0305216 A1\* 10/2019 Gosavi .................. H10N 52/00

FOREIGN PATENT DOCUMENTS

| CN | 111490156 A | \* | 8/2020 | ........... H01L 27/222 |
| EP | 3863015 A1 | \* | 8/2021 | ........... G11C 11/161 |

OTHER PUBLICATIONS

CN-111490156-A english translation Aug. 4, 2020.\*
Garello et al., "Manufacturable 300mm platform solution for Field-Free Switching SOT-MRAM", 2019 Symposium on VLSI Technology Digest of Technical Papers, 2019, total 2 pages.
(Continued)

*Primary Examiner* — Latanya N Crawford Eason
(74) *Attorney, Agent, or Firm* — Birch, Stewart, Kolasch & Birch, LLP

(57) ABSTRACT

A memory structure comprises a dielectric layer, a first ferromagnetic bottom electrode, a second ferromagnetic bottom electrode, an SOT channel layer, and an MTJ structure. The dielectric layer is over the substrate. The first ferromagnetic bottom electrode extends through the dielectric layer. The second ferromagnetic bottom electrode extends through the dielectric layer, and is spaced apart from the first ferromagnetic bottom electrode. The SOT channel layer extends from the first ferromagnetic bottom electrode to the second ferromagnetic bottom electrode. The MTJ structure is over the SOT channel layer.

20 Claims, 23 Drawing Sheets

(56) References Cited

OTHER PUBLICATIONS

Honjo et al., "First demonstration of field-free SOT-MRAM with 0.35 ns write speed and 70 thermal stability under 400° C. thermal tolerance by canted SOT structure and its advanced patterning/SOT channel technology", 2019 IEEE International Electron Devices Meeting (IEDM), 2019, pp. 28.5.1-28.5.4.

Sato et al., "CMOS Compatible Process Integration of SOT-MRAM with Heavy-Metal Bi-Layer Bottom Electrode and 10ns Field-Free SOT Switching with STT Assist", 2020 Symposium on VLSI Technology Digest of Technical Papers, 2020, total 2 pages.

Tang et al., "Magnetic Memory Technology: Spin-Transfer-Torque MRAM and Beyond", Wiley-IEEE Press, 2021, total 354 pages.

Tsou et al., "Write Margin Analysis of Spin-Orbit Torque Switching Using Field-Assisted Method", IEEE JXCDC, Dec. 2019, vol. 5, No. 2, pp. 173-181.

Valenzuela et al., "Direct electronic measurement of the spin Hall effect", Nature, Jul. 13, 2006, vol. 442, pp. 176-179.

\* cited by examiner

MEMORY STRUCTURE AND FORMATION METHOD THEREOF

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. Magnetic tunnel junctions (MTJs) can be used in hard disk drives and/or RAM, and thus are promising candidates for next generation memory solutions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
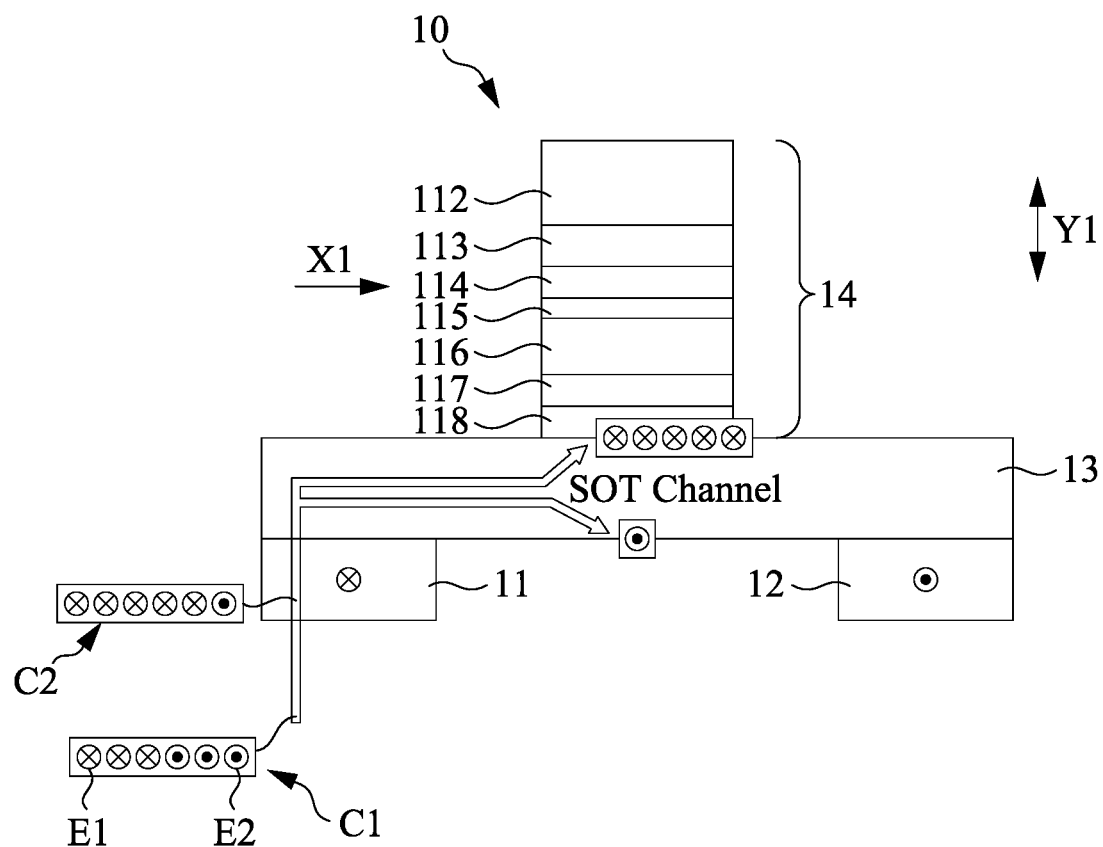
FIG. 1 is a cross-sectional view illustrating a mechanism of SOT switching of an SOT-MRAM cell according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magneto-resistive random-access memory (MRAM) cells each comprise a magnetic tunnel junction (MTJ) cell vertically arranged within an integrated chip back-end-of-the-line (BEOL) between conductive electrodes. An MTJ cell includes first and second ferromagnetic layers separated by a tunnel barrier layer. One of the ferromagnetic layers (often referred to as a "reference layer" or "pinned layer") has a fixed magnetization direction (also called magnetization orientation), while the other ferromagnetic layer (often referred to as a "free layer") has a variable or switchable magnetization direction. For MTJ cells with positive tunnelling magnetoresistance (TMR), if the magnetization directions of the reference layer and free layer are in a parallel orientation, it is more likely that electrons will tunnel through the tunnel barrier layer, such that the MTJ cell is in a low-resistance state. Conversely, if the magnetization directions of the reference layer and free layer are in an anti-parallel orientation, it is less likely that electrons will tunnel through the tunnel barrier layer, such that the MTJ cell is in a high-resistance state. Consequently, the MTJ cell can be switched between two states of electrical resistance, a first state with a low resistance ($R_P$: magnetization directions of reference layer and free layer are parallel) and a second state with a high resistance ($R_{AP}$: magnetization directions of reference layer and free layer are anti-parallel). Because of their binary nature, MTJ cells can be used to store digital data, with the low resistance state $R_P$ corresponding to a first data state (e.g., logical "0"), and the high-resistance state $R_{AP}$ corresponding to a second data state (e.g., logical "1").

In a spin transfer torque ("STT") MRAM ("STT-MRAM") cell, the write current is applied passing through the entire MTJ, i.e., reference layer, the tunnel barrier layer, and the free layer, which sets the magnetization direction of the free layer through the spin transfer torque effect. That is, the write current passes through a same path as the read path of the MRAM. In a spin-orbit torque ("SOT") MRAM ("SOT-MRAM") cell, a MTJ structure is positioned on a heavy metal layer with large spin-orbit interaction. The free layer is in contact with the heavy metal layer. Spin torque is induced by the in-plane current injected through the heavy metal layer under the spin-orbit coupling effect, which generally includes one or more of the Rashba effect or the spin Hall effect ("SHE effect"). The write current does not pass through the vertical MTJ. Instead, the write current passes through the heavy metal layer in an in-plane direction (i.e., direction parallel with a major surface (top or bottom surface) of the heavy metal layer). The magnetization direction in the free layer is set through the SOT effect. More specifically, when a current is injected in-plane in the heavy metal layer, the spin orbit coupling leads to an orthogonal spin current which creates a spin torque and induce magnetization reversal in the free layer. The heavy metal layer can be referred to as an SOT channel layer.

In the SOT-MRAM technology, a lower charge current flowing through the SOT channel layer results in a higher SOT efficiency to switch the magnetization state of the MTJ structure. Embodiments of the present disclosure are directed to a new structure of bottom electrodes under the SOT channel layer, wherein the bottom electrodes are formed from ferromagnetic materials with magnetization. The magnetization of the bottom electrode can polarize the spin of electrons of an input current into a spin-polarized current, which leads to imbalance between spin-up electron numbers and spin-down electron numbers. Resultantly, more electrons can be accumulated at a boundary between the SOT channel layer and the free layer of the MTJ structure, which in turn generates stronger magnetic torques in the free layer of the MTJ structure. Therefore, the ferromagnetic bottom electrodes improve the conversion rate from an in-plane charge current flowing through the SOT channel layer to a magnetic torque on the magnetization of the free layer of the MTJ structure. Therefore, the in-plane current flowing through the SOT channel layer for switching the magnetization direction of the free layer can be reduced.

FIG. 1 is a cross-sectional view illustrating a mechanism of SOT switching of an SOT-MRAM cell 10 according to some embodiments of the present disclosure. The SOT-MRAM cell 10 includes a first ferromagnetic bottom electrodes 11, a second ferromagnetic bottom electrode 12, an SOT channel layer 13 extending across both the first and second ferromagnetic bottom electrodes 11, 12, and an MTJ cell (interchangeably referred to as MTJ structure or MTJ cell) 14 over the SOT channel layer 13.

The MTJ cell 14 includes a free layer 118 having a magnetization direction which is free to be switched by the SOT effect when the SOT channel layer 12 receives a current higher than or equal to a current that is sufficient to switch the magnetization direction of the free layer 130. Therefore, the free layer 130 is capable of changing its magnetization direction between one of two magnetization states, which cause two different MTJ resistances that correspond to the binary data state. In some embodiments, the free layer 130 can comprise a ferromagnetic metal, such as iron, nickel, cobalt and alloys thereof, for example. For instance, in some embodiments, the free layer 130 can comprise cobalt, iron, and boron, such as a CoFeB ferromagnetic free layer. In some embodiments, the free layer 130 is a multilayer structure such as a tri-layer structure including a stack of a CoFeB layer, a metal spacer layer, and another CoFeB layer. In some embodiments, the free layer 118 has a thickness in a range from about 0.1 nm to about 100 nm.

The MTJ cell 14 includes a tunnel barrier layer 117 formed over the free layer 118. The tunnel barrier layer 117 is thin enough to allow quantum mechanical tunneling of current between the ferromagnetic free layer 118 and the ferromagnetic reference layer 116. In some embodiments, the tunnel barrier layer 117 can comprise crystalline barrier, such as manganese oxide (MgO) or spinel (MgAl$_2$O$_4$ a.k.a. MAO); or an amorphous barrier, such as aluminum oxide (AlO$_x$) or titanium oxide (TiO$_x$). In some embodiments, the tunnel barrier layer 117 has a thickness in a range from about 0.1 nm to about 10 nm. In some embodiments, a metal capping layer (e.g., Ta or Ru) is disposed over the free layer 118, and the metal capping layer has a thickness in a range from about 0.1 nm to about 100 nm.

The MTJ cell 14 includes a reference layer 116 formed over the tunnel barrier layer 117. In some embodiments, the reference layer 116 may be formed of a ferromagnetic material, such as one or more layers of Fe, CoFe, NiFe, CoFeB, CoFeBW, alloys thereof, the like, or combinations thereof. The reference layer 116 has a thickness in a range from about 0.1 nm to about 100 nm. For example, the reference layer 116 has a thickness in a range from about 0.1 nm to about 5 nm. The ferromagnetic reference layer 116 has a magnetization direction that is "fixed" and will not respond to a typical magnetic field. The free layer 118 and the reference layer 116 include a same magnetic anisotropy. Specifically, the free layer 118 and the reference layer 116 either both have in-plane magnetic anisotropy or both have perpendicular magnetic anisotropy.

The MTJ cell 14 further includes a metal spacer layer 115 formed over the reference layer 116. In some embodiments, the metal spacer layer 115 may be formed of material such as Ta, W, Mo, the like, or combinations thereof, and include a thickness in a range from about 0.1 nm to about 10 nm. For example, the metal spacer layer 115 has a thickness in a range from about 0.1 nm to about 1 nm.

The MTJ cell 14 further includes a first ferromagnetic multilayer film 114, a second ferromagnetic multilayer film 112 and a non-magnetic spacer layer 113 sandwiched between the ferromagnetic multilayer films 112 and 114. In some embodiments, the ferromagnetic multilayer films 112, 114 each are made of (Co/Pt)n, (Co/Ni)n or the like where n is the number of laminates (e.g., n ranges from about 1-10), and a total thickness of each multilayer film is in a range from about 0.1 nm to about 100 nm (e.g., in a range from about 0.1 nm to about 50 nm). In some embodiments, the non-magnetic spacer layer 113 may be formed of material such as Ru, Ir, W, Ta, Mo Mg, the like, or combinations thereof, and include a thickness in a range from about 0.1 nm to about 10 nm (e.g., in a range from about 0.1 nm to about 5 nm). The ferromagnetic multilayer films 112, 114, and the spacer layer 113 can collectively serve as a synthetic anti-ferromagnetic (SAF) layer to pin the magnetization direction of the reference layer 116 in a fixed direction. Pinning the magnetization direction of the reference layer 116 allows the MTJ cell 14 of to be toggled between the low-resistance state and the high-resistance state by changing the magnetization direction of the free layer 118 relative to the reference layer 116. In some embodiments, the MTJ cell 14 further includes a seed layer formed from a metal such as Pt, Ta, Ru, or the like.

A SOT channel layer 13 is positioned adjacent to and in electrical coupling with the free layer 118. In an embodiment, the SOT channel layer 13 is in direct contact with the free layer 118. For example, a top surface of the SOT channel layer 13 is in direct contact with a bottom surface of the free layer 118. In some embodiments, to maximize the spin Hall effect ("SHE") between the SOT channel layer 13 and the free layer 116, an interface area between the SOT channel layer 13 and the free layer 118 substantially fully overlaps the bottom surface of the free layer 118. That is, the top surface of the SOT channel layer 13 substantially fully overlaps the bottom surface of the free layer 118. In some embodiments, the top surface of the SOT channel layer 13 is larger than the bottom surface of the free layer 118 in at least some directions.

Due to the tunnel magnetoresistance effect, the resistance value between the reference layer 116 and the free layer 118 changes with the magnetization direction switches in the free layer 118. The parallel magnetizations (P state) lead to a lower electric resistance across the MTJ cell 14, whereas the anti-parallel magnetizations (AP state) lead to a higher electric resistance across MTJ cell 14. The two states of the resistance values are considered as two logic states "1" or "0" that are stored in the SOT-MRAM cell 10.

The SOT channel layer 13 serves as a spin-orbit interaction active layer to provide induction influence on the MTJ cell 14, especially the free layer 118. Therefore, the magnetic direction of the free layer 118 is switched using the spin-orbit torque effect. The SOT channel layer 13 includes non-magnetic heavy metal, such as tungsten (W), tantalum (Ta) or the like, and has a thickness in a range from about 0.1 nm to about 50 nm. In the write operation of the SOT-MRAM cell 10, an in-plane charge current flows through the SOT channel layer 13 between the bottom electrodes 11 and 12. The in-plane current flowing in the SOT channel layer 13 induces spin Hall effect, where spin-up and spin-down electrons are separated in the out-of-plane direction Y1 (i.e., the direction perpendicular to the major surface (e.g., top or bottom surface) of the SOT channel layer 13), which in turn results in an spin current. The direction of spin current ($J_s$) is perpendicular to the direction of charge current ($J_c$). The accumulated spins at the interface between the free layer 118 and the SOT channel layer 13 exerts a spin torque by the spin-orbit interaction, which in turn flips the magnetization of the free layer 118.

In some embodiments of the present disclosure, the bottom electrodes 11 and 12 include ferromagnetic materials with magnetization, and thus the bottom electrodes 11 and 12 can polarize the spin of electrons of an incoming current into a spin polarized current. For example, as illustrated in FIG. 1, if the first ferromagnetic bottom electrode 11 serves as an input electrode to inject a charge current into the SOT channel layer 13, the first ferromagnetic bottom electrode 11 receives an unpolarized input current C1 that includes equal numbers of first-type electrons E1 of a first spin type and second-type electrons of a second spin type that is different than the first spin type. In some embodiments, the first spin type is spin-up, and the second spin type is spin-down. In some embodiments, the first spin type is spin-down, and the second spin type is spin-up.

When the input current C1 travels in the ferromagnetic bottom electrode 11, the ferromagnetic bottom electrode 11 polarizes the input current C1 into a spin-polarized current C2 which includes unequal numbers of the first-type electrons E1 and the second-type electrons E2. Majority electrons in the spin-polarized current have their spins polarized in the same direction as the magnetization of the ferromagnetic bottom electrode 11. For example, as illustrated in FIG. 1, the spin-polarized current C2 has more first-type electrons E1 than second-type electrons E2, if the spin moment direction of the first-type electrons E1 is parallel with the magnetization direction of the ferromagnetic bottom electrode 11 and the spin moment direction of the second-type electrons E2 is antiparallel with the magnetization direction of the ferromagnetic bottom electrode 11.

Figure 5:
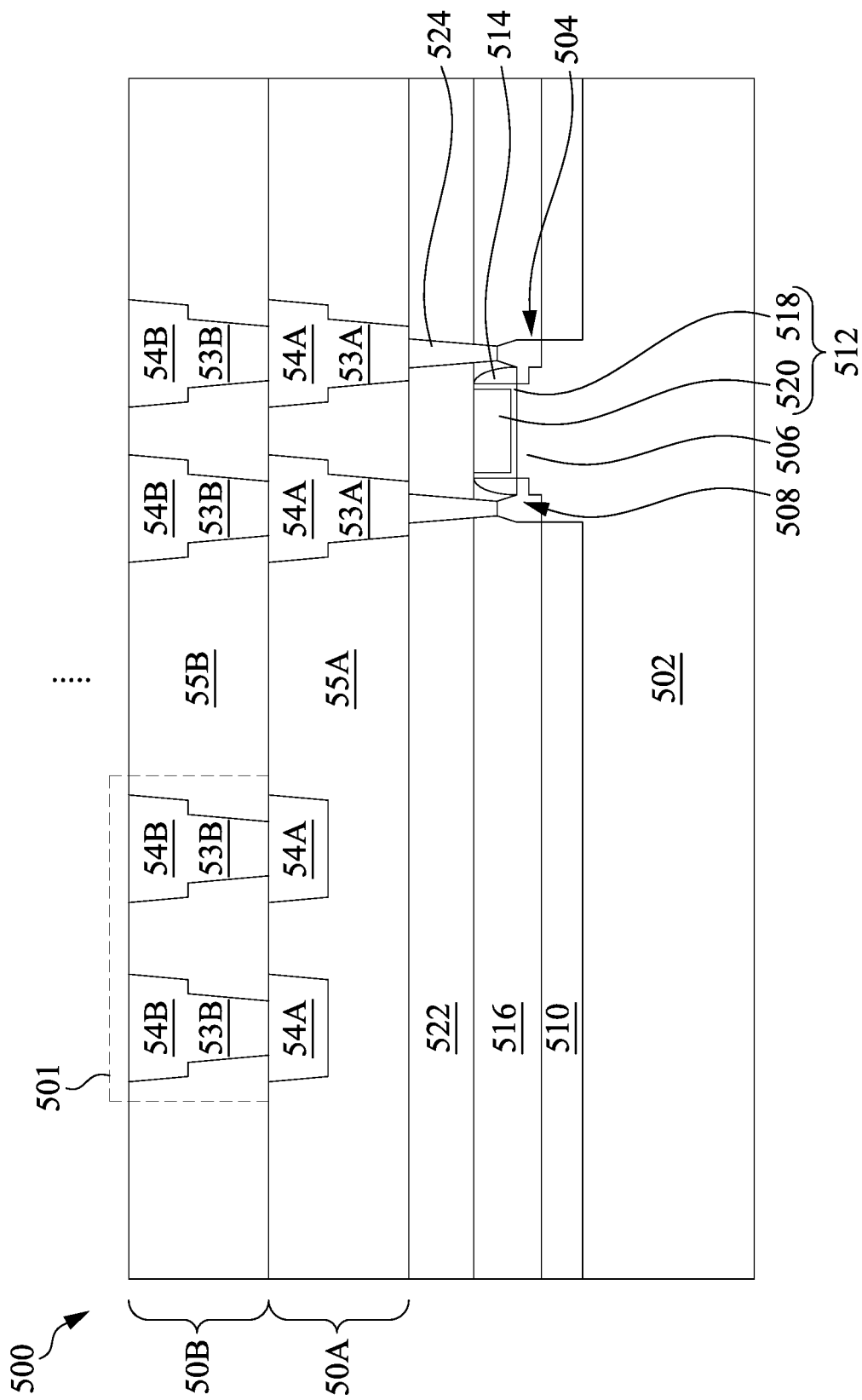
FIGS. 5-23 illustrate cross-sectional views of intermediate stages in formation of an example integrated circuit structure 500 having the SOT-MRAM cell 10 in accordance with some embodiments of the present disclosure.

When the spin-polarized current C2 flows from the ferromagnetic bottom electrode 11 into the SOT channel layer 13 along a first in-plane direction X1, one or more of the spin Hall effect and the Rashba effect cause the first-type electrons E1 of the first spin type and the second-type electrons E2 of the second spin type to be separated in the out-of-plane direction Y1. In some embodiments where the spin-polarized current C2 flowing in first in-plane direction X1 (e.g., from left side to right side as illustrated in FIG. 1) tends to make the first-type electrons E1 move toward the top surface of the SOT channel layer 13 and to make the second-type electrons E2 move toward the bottom surface of the SOT channel layer 13, a number of first-type electrons E1 accumulated on the top surface of the SOT channel layer 13 is more than a number of second-type electrons E2 accumulated on the bottom surface of the SOT channel layer 13. The increased number of electrons E1 accumulated on the top surface of the SOT channel layer 13 results in a stronger magnetic torque in the free layer 118, which in turn improves the SOT efficiency. Therefore, the charge current provided to the SOT channel layer 13 from the bottom electrode 11 for switching the magnetization direction of the free layer 118 can be reduced, which means a reduced MRAM write current can be achieved. Reduction of the MRAM write current may benefit scaling down the footprint of MRAM access transistors (e.g., transistors 504 as shown in FIG. 5) and hence the MRAM cell size.

In some embodiments, the first and second ferromagnetic bottom electrodes 11 and 12 may have a same magnetic anisotropy. Specifically, the first and second ferromagnetic bottom electrodes 11 and 12 either both have in-plane magnetic anisotropy or both have perpendicular magnetic anisotropy. In some embodiments, the magnetization directions of the first ferromagnetic bottom electrode 11 and the second ferromagnetic bottom electrode 12 may be anti-parallel. In other words, the magnetization direction of the second ferromagnetic bottom electrode 12 is opposite the magnetization direction of the first ferromagnetic bottom electrode 11. The anti-parallel magnetization orientation between the first and second ferromagnetic bottom electrodes 11, 12 allows for more electrons accumulated on the top surface of the SOT channel layer 13, regardless of the charge current flowing in the SOT channel layer 13 along the first in-plane direction X1 or along a second in-plane direction X2 opposite the first in-plane direction X2.

Figure 2:
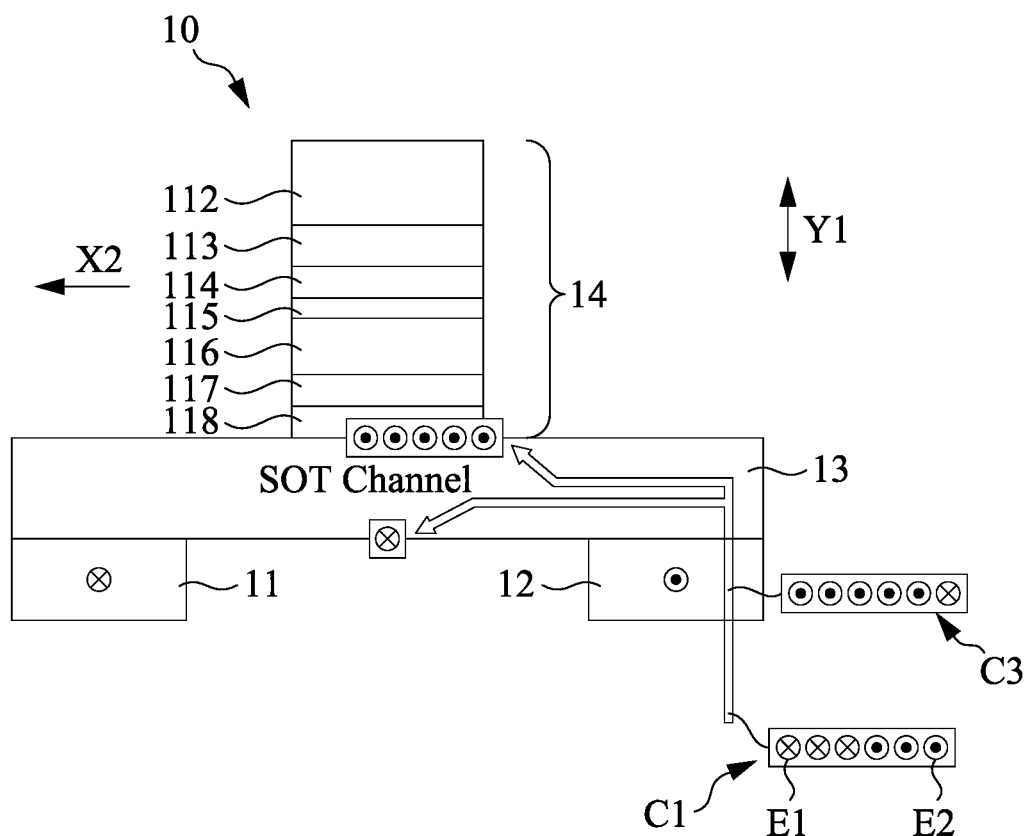
FIG. 2 is a cross-sectional view illustrating another mechanism of SOT switching of an SOT-MRAM cell according to some embodiments of the present disclosure.

For example, as illustrated in FIG. 2, if the second ferromagnetic bottom electrode 12 serves as an input electrode to inject a charge current into the SOT channel layer 13, the second ferromagnetic bottom electrode 12 receives an unpolarized input current C1 that includes equal numbers of first-type electrons E1 of the first spin type and second-type electrons of the second spin type. When the input current C1 travels in the ferromagnetic bottom electrode 12, it is polarized into a spin-polarized current C3 that includes unequal numbers of the first-type electrons E1 and the second-type electrons E2. Majority electrons in the spin-polarized current have their spins polarized in the same direction as the magnetization of the ferromagnetic bottom electrode 12. Therefore, in FIG. 2, the spin-polarized current C3 has more second-type electrons E2 than first-type electrons E1, because the spin moment direction of the second-type electrons E2 is parallel with the magnetization direction of the ferromagnetic bottom electrode 12 and the spin moment direction of the first-type electrons E1 is antiparallel with the magnetization direction of the ferromagnetic bottom electrode 12.

When the spin-polarized current C3 flows from the second ferromagnetic bottom electrode 12 into the SOT channel layer 13 along the second in-plane direction X2, which is opposite the first in-plane direction X1 as shown in FIG. 1, one or more of the spin Hall effect and the Rashba effect cause the first-type electrons E1 of the first spin type and the second-type electrons E2 of the second spin type to be separated in the out-of-plane direction Y1. In some embodiments where the spin-polarized current C3 flowing along the second in-plane direction X2 (e.g., from right side to left side as illustrated in FIG. 2) tends to make the second-type electrons E2 move toward the top surface of the SOT channel layer 13 and make the first-type electrons E1 move toward the bottom surface of the SOT channel layer 13, a number of second-type electrons E2 accumulated on the top surface of the SOT channel layer 13 is more than a number of first-type electrons E1 accumulated on the bottom surface of the SOT channel layer 13. The increased number of electrons E2 accumulated on the top surface of the SOT channel layer 13 results in a stronger magnetic torque in the free layer 118, which in turn improves the SOT efficiency.

Figure 3:
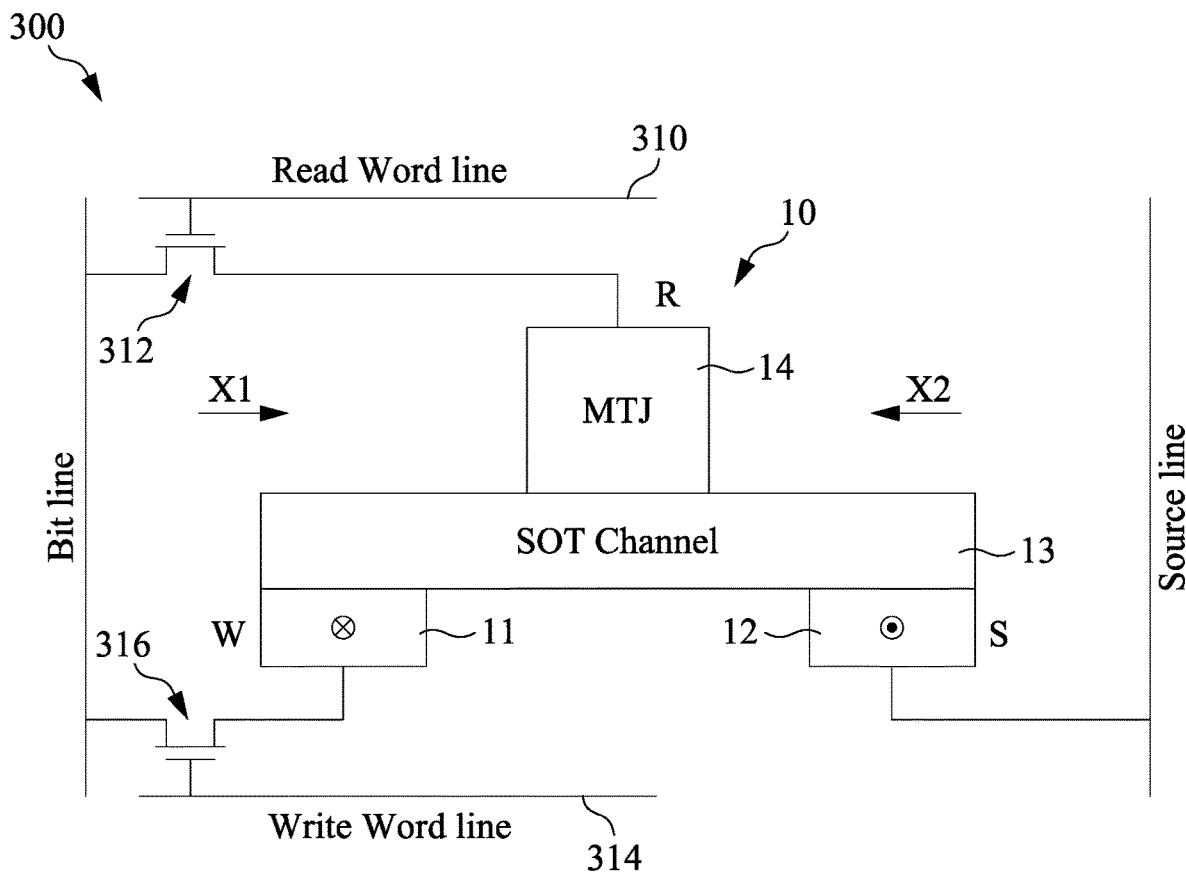
FIG. 3 is a schematic view illustrating an example circuit of operating SOT-MRAM cell in accordance with some embodiments of the present disclosure.

FIG. 3 is a schematic view illustrating an example circuit 300 of operating SOT-MRAM cell 10 in accordance with some embodiments of the present disclosure. The SOT-MRAM cell 10 includes three terminals R, W and S. In a read operation, a signal from a read control line, e.g., a read Word line 310, turns on a read transistor 312 to enable a read current to flow between a Bit line and a Source line through the MTJ cell 14. A value of the read current indicates the resistance value of the MTJ cell 14, i.e., the logic state stored in the SOT-MRAM cell 10. In a write operation, a signal from a write control line, e.g., a write Word line 314, turns on a write transistor 316 to enable a write current to pass through the SOT channel layer 13 to generate a spin-orbit torque that changes the magnetization direction of the free layer in the MTJ cell 14. In the illustrated embodiment, the write current flows in the first in-plane direction X1 from the first ferromagnetic bottom electrode 11 to the second ferromagnetic bottom electrode 12. In some other embodiments, the write current flows in the second in-plane direction X2 from the second ferromagnetic bottom electrode 12 to the first ferromagnetic bottom electrode 12. Write current flowing either in the first in-plane direction X1 or the second in-plane direction X2 causes more electrons accumulated on the top surface of the SOT channel layer 13 than on the bottom surface of the SOT channel layer 13, because of the ferromagnetic bottom electrodes 11 and 12 having antiparallel magnetization directions, as discussed in detail above.

It is understood that FIG. 3 is merely one example circuit of operating the SOT-MRAM cell 10. In some other embodiments, the SOT-MRAM cell 10 can be operated using various circuits.

Figure 4A:
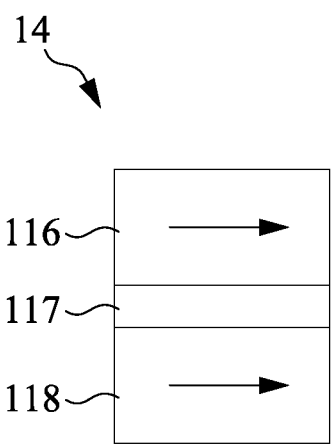
FIGS. 4A-4D show example magnetization orientations of the MTJ cell in accordance with some embodiments of the present disclosure.
Figure 4B:
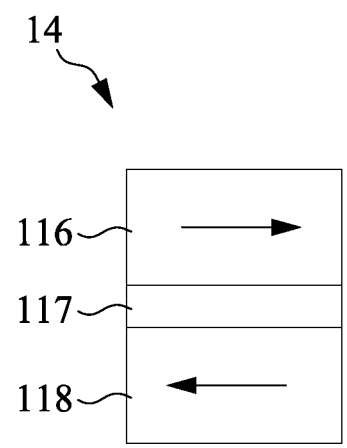

FIGS. 4A-4D show example magnetization orientations of the MTJ cell 14. In FIG. 4A, the reference layer 116 and the free layer 118 are magnetically oriented in a same direction, which means the magnetization directions of the reference layer 116 and free layer 118 are parallel. In FIG. 4B, the reference layer 116 and the free layer 118 are magnetically oriented in opposite directions, which means the magnetization directions of the reference layer 116 and free layer 118 are anti-parallel. In some embodiments, as illustrated in FIGS. 4A and 4B, the magnetization directions are in-plane (parallel to the surfaces of the MTJ layers) and the magnetization direction of the free layer 118 changes between the left-to-right direction (as shown by the unidirectional arrow in the free layer 118 in FIG. 4A) and the right-to-left direction (as shown by the unidirectional arrow in the free layer 118 in FIG. 4B). That is, directions of easy magnetization axes of the reference layer 116 and the free layer 118 are in-plane. Switching the magnetization direction between the left-to-right direction and the right-to-left direction can be triggered by the SOT channel layer 13 using the spin-orbit torque effect.

Figure 4C:
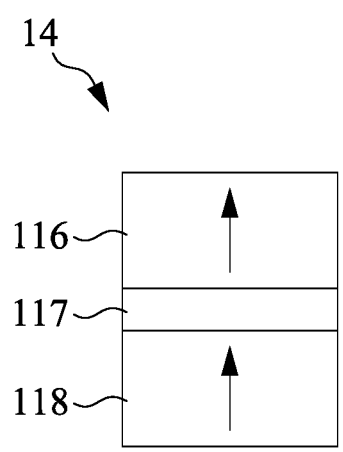
Figure 4D:
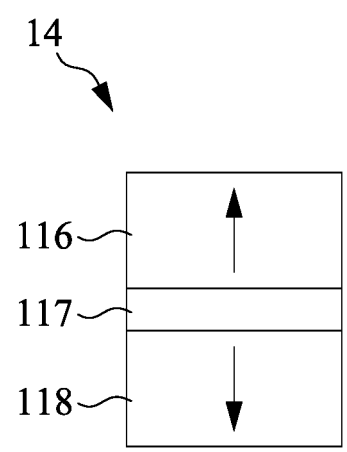

In some embodiments, as illustrated in FIGS. 4C and 4D, the magnetization directions are perpendicular to the surfaces of the MTJ layers, and the magnetization direction of the free layer 118 changes between the upward direction (as shown by the unidirectional arrow in the free layer 118 in FIG. 4C) and the downward direction (as shown by the unidirectional arrow in the free layer 118 in FIG. 4D). Switching the magnetization direction between the upward direction and the downward direction can be triggered by the SOT channel layer 13 using the spin-orbit torque effect.

The resistance of a same-oriented MTJ cell 14 shown in FIG. 4A or 4C is less than the resistance of an opposite-oriented MTJ cell shown in FIG. 4B or 4D, and thus the MTJ cell 14 have a low resistance state $R_P$ corresponding to a first data state (e.g., logical "0"), and a high-resistance state $R_{AP}$ corresponding to a second data state (e.g., logical "1"). The stored data in the MTJ cell 14 does not require a storage energy source, the memory is non-volatile.

FIGS. 5-23 illustrate cross-sectional views of intermediate stages in formation of an example integrated circuit structure 500 having the SOT-MRAM cell 10 in accordance with some embodiments of the present disclosure. Although the cross-sectional views and top views shown in FIGS. 5-23 are described with reference to a method, it will be appreciated that the structures shown in FIGS. 5-23 are not limited to the method but rather may stand alone separate of the method. Although FIGS. 5-23 are described as a series of acts, it will be appreciated that these acts are not limiting in that the order of the acts can be altered in other embodiments, and the methods disclosed are also applicable to other structures.

FIG. 5 illustrates a cross-sectional view of an example semiconductor structure 500 comprising a semiconductor substrate 502 in which various electronic devices may be formed, and a portion of a multilevel interconnect structure (e.g., layers 50A and 50B) formed over the substrate 502, in accordance with some embodiments. Generally, FIG. 5 illustrates a transistor 504 formed on the substrate 502, with multiple interconnection layers formed thereover. As indicated by the ellipsis at the top of FIG. 5, multiple interconnect levels may be similarly stacked in the fabrication process of an integrated circuit. As illustrated, the transistor 504 is a FinFET. In some other embodiments, the transistor 504 is a planar FET, a nanosheet FET, or other suitable FET. The transistor 504 can serve as an access transistor for an SOT-MRAM cell in some embodiments.

The substrate 502 illustrated in FIG. 5 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The FinFET device 504 illustrated in FIG. 5 is a three-dimensional MOSFET structure formed in fin-like strips of semiconductor protrusions 506 referred to as fins. The cross-section shown in FIG. 5 is taken along a longitudinal axis of the fin in a direction parallel to the direction of the current flow between the source and drain regions 508. The fin 506 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 506 by etching a trench into the substrate 502 using, for example, reactive ion etching (RIE). FIG. 5 illustrates a single fin 506, although the substrate 502 may comprise any number of fins.

Shallow trench isolation (STI) regions 510 formed along opposing sidewalls of the fin 506 are illustrated in FIG. 5. STI regions 510 may be formed by depositing one or more dielectric materials (e.g., silicon oxide) to completely fill the trenches around the fins and then recessing the top surface of the dielectric materials. The dielectric materials of the STI regions 510 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 510 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 510 such that an upper portion of fin 506 protrudes from surrounding insulating STI regions 510. In some cases, the patterned hard mask used to form the fin 506 may also be removed by the planarization process.

In some embodiments, the gate structure 512 of the FinFET device 504 illustrated in FIG. 5 is a high-k, metal gate (HKMG) gate structure that may be formed using a gate-last process flow. In a gate last process flow a sacrificial dummy gate structure (not shown) is formed after forming the STI regions 510. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 510. As described in greater detail below, the dummy gate structure may be replaced by the HKMG gate structure 512 as illustrated in FIG. 5. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 508 and spacers 514 of FinFET 504, illustrated in FIG. 5, are formed, for example, self-aligned to the dummy gate structures. Spacers 514 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 514 along the sidewalls of the dummy gate structures.

Source and drain regions (also collectively referred to as source/drain regions or S/D regions) 508 are semiconductor regions in direct contact with the semiconductor fin 506. In some embodiments, the source and drain regions 508 may comprise heavily-doped regions and relatively lightly-doped drain extensions, or LDD regions. Generally, the heavily-doped regions are spaced away from the dummy gate structures using the spacers 514, whereas the LDD regions may be formed prior to forming spacers 514 and, hence, extend under the spacers 514 and, in some embodiments, extend further into a portion of the semiconductor fin 506 below the dummy gate structure. The LDD regions may be formed, for example, by implanting dopants (e.g., As, P, B, In, or the like) using an ion implantation process.

In some embodiments, the source and drain regions 508 may comprise an epitaxially grown region. For example, after forming the LDD regions, the spacers 514 may be formed and, subsequently, the heavily-doped source and drain regions may be formed self-aligned to the spacers 514 by first etching the fins 506 to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 5. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm to $10^{18}$ cm$^{-2}$) of dopants may be introduced into the heavily-doped source and drain regions 508 either in situ during SEG, or by an ion implantation process performed after the SEG, or by a combination thereof.

A first interlayer dielectric (ILD) 516 is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD 516. The HKMG gate structures 512, illustrated in FIG. 5, may then be formed by first removing the dummy gate structures using one or more etching techniques, thereby creating trenches between respective spacers 514. Next, a replacement gate dielectric layer 518 comprising one more dielectrics, followed by a replacement conductive gate layer 520 comprising one or more conductive materials, are deposited to completely fill the recesses. Excess portions of the gate structure layers 518 and 520 may be removed from over the top surface of first ILD 516 using, for example a CMP process. The resulting structure, as illustrated in FIG. 5, may be a substantially coplanar surface comprising an exposed top surface of first ILD 516, spacers 514, and remaining portions of the HKMG gate layers 518 and 520 inlaid between respective spacers 514.

The gate dielectric layer 518 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 520 may be a multilayered metal gate stack comprising a barrier layer, a work function layer, and a gate-fill layer formed successively on top of gate dielectric layer 518. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, physical vapor deposition (PVD), ALD, PEALD, electrochemical plating (ECP), electroless plating and/or the like.

A second ILD layer 522 may be deposited over the first ILD layer 516, as illustrated in FIG. 5. In some embodiments, the insulating materials to form the first ILD layer 516 and the second ILD layer 522 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 516 and the second ILD layer 522 may be deposited using any suitable method, such as CVD, physical vapor deposition (PVD), ALD, PEALD, PECVD, SACVD, FCVD, spin-on, and/or the like, or a combination thereof.

As illustrated in FIG. 5, electrodes of electronic devices formed in the substrate 502 may be electrically connected to conductive features of a first interconnect level 50A using conductive connectors (e.g., contacts 524) formed through the intervening dielectric layers. In the embodiment illustrated in FIG. 5, the contacts 524 make electrical connections to the source and drain regions 508 of FinFET 504. Contacts 524 to gate electrodes may be formed over STI regions 510, and thus are not shown in the cross-section view of FIG. 5. The contacts may be formed using photolithography techniques. For example, a patterned mask may be formed over the second ILD 522 and used to etch openings that extend through the second ILD 516 to expose a portion of gate structures 512, as well as etch openings that extend further through the first ILD 516 and the CESL (if present) liner below first ILD 516 to expose portions of the source and drain regions 508.

In some embodiments, a conductive liner may be formed in the openings in the first ILD layer 516 and the second ILD layer 522. Subsequently, the openings are filled with a conductive fill material. The liner comprises barrier metals used to reduce out-diffusion of conductive materials from the contacts 524 into the surrounding dielectric materials. In some embodiments, the liner may comprise two barrier metal layers. The first barrier metal comes in contact with the semiconductor material in the source and drain regions 508 and may be subsequently chemically reacted with the heavily-doped semiconductor in the source and drain regions 508 to form a low resistance ohmic contact, after which the unreacted metal may be removed. For example, if the heavily-doped semiconductor in the source and drain regions 508 is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the second ILD 522. The resulting conductive plugs extend into the first and second ILD layers 516 and 522 and constitute contacts 524 making physical and electrical connections to the electrodes of electronic devices, such as the tri-gate FinFET 504 illustrated in FIG. 5.

As illustrated in FIG. 5, multiple interconnect levels may be formed, stacked vertically above the contact plugs 524 formed in the first and second ILD layers 516 and 522, in accordance with a back end of line (BEOL) scheme adopted for the integrated circuit design. In the BEOL scheme illustrated in FIG. 5, various interconnect levels have similar features. However, it is understood that other embodiments may utilize alternate integration schemes wherein the various interconnect levels may use different features. For example, the contacts 524, which are shown as vertical connectors, may be extended to form conductive lines which transport current laterally.

In this disclosure, the second interconnect level comprises conductive vias and lines embedded in an inter-metal dielectric (IMD) layer. In addition to providing insulation between various conductive elements, an IMD layer may include one or more dielectric etch stop layers to control the etching processes that form openings in the IMD layer. Generally, vias conduct current vertically and are used to electrically connect two conductive features located at vertically adjacent levels, whereas lines conduct current laterally and are used to distribute electrical signals and power within one level. In the BEOL scheme illustrated in FIG. 5, conductive vias 53A connect contacts 524 to conductive lines 54A and, at subsequent levels, vias connect lower lines to upper lines (e.g., a pair of lines 54A and 54B can be connected by via 53B). Other embodiments may adopt a different scheme. For example, vias 53A may be omitted from the second level and the contacts 524 may be configured to be directly connected to lines 54A.

The first interconnect level 50A may be formed using, for example, a dual damascene process flow. First, a dielectric stack used to form IMD layer 55A may be deposited using one or more layers of the dielectric materials listed in the description of the first and second ILD layers 516 and 522. In some embodiments, IMD layer 55A includes an etch stop layer (not shown) positioned at the bottom of the dielectric stack. The etch stop layer comprises one or more insulator layers (e.g., SiN, SiC, SiCN, SiCO, CN, combinations thereof, or the like) having an etch rate different than an etch rate of an overlying material. The techniques used to deposit the dielectric stack for IMD may be the same as those used in forming the first and second ILD layers 516 and 522.

Appropriate photolithography and etching techniques (e.g., anisotropic RIE employing fluorocarbon chemistry) may be used to pattern the IMD layer 55A to form openings for vias and lines. The openings for vias may be vertical holes extending through IMD layer 55A to expose a top conductive surface of contacts 524, and openings for lines may be longitudinal trenches formed in an upper portion of the IMD layer 55A. In some embodiments, the method used to pattern holes and trenches in IMD 55A utilizes a via-first scheme, wherein a first photolithography and etch process form holes for vias, and a second photolithography and etch process form trenches for lines. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of IMD layer 55A and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

Several conductive materials may be deposited to fill the holes and trenches forming the conductive features 53A and 54A of the first interconnect level 50A. The openings may be first lined with a conductive diffusion barrier material and then completely filled with a conductive fill material deposited over the conductive diffusion barrier liner. In some embodiments, a thin conductive seed layer may be deposited over the conductive diffusion barrier liner to help initiate an electrochemical plating (ECP) deposition step that completely fills the openings with a conductive fill material.

The diffusion barrier conductive liner in the vias 53A and lines 54A comprises one or more layers of TaN, Ta, TiN, Ti, Co, or the like, or combinations thereof. The conductive fill layer in the vias 53A and lines 54A may comprise metals such as Cu, Al, W, Co, Ru, or the like, or combinations thereof, or multi-layers thereof. The conductive materials used in forming the conductive features 53A and 54A may be deposited by any suitable method, for example, CVD, PECVD, PVD, ALD, PEALD, ECP, electroless plating and the like. In some embodiments, the conductive seed layer may be of the same conductive material as the conductive fill layer and deposited using a suitable deposition technique (e.g., CVD, PECVD, ALD, PEALD, or PVD, or the like).

Any excess conductive material over the IMD 55A outside of the openings may be removed by a planarizing process (e.g., CMP) thereby forming a top surface comprising dielectric regions of IMD 55A that are substantially coplanar with conductive regions of the conductive lines 54A. The planarization step embeds the conductive vias 53A and conductive lines 54A into IMD 55A, as illustrated in FIG. 5.

The interconnect level positioned vertically above the first interconnect level 50A in FIG. 5, is the second interconnect level 50B. In some embodiments, the structures of the various interconnect levels (e.g., the first interconnect level 50A and the second interconnect level 50B) may be similar. In the example illustrated in FIG. 5, the second interconnect level 50B comprises conductive vias 53B and conductive lines 54B embedded in an insulating film IMD 55B having a planar top surface. The materials and processing techniques described above in the context of the first interconnect level 50A may be used to form the second interconnect level 50B and subsequent interconnect levels.

Although an example electronic device (FinFET 504) and example interconnect structures making connections to the electronic device are described, it is understood that one of ordinary skill in the art will appreciate that the above examples are provided for illustrative purposes only to further explain applications of the present embodiments, and are not meant to limit the present embodiments in any manner.

Figure 6:
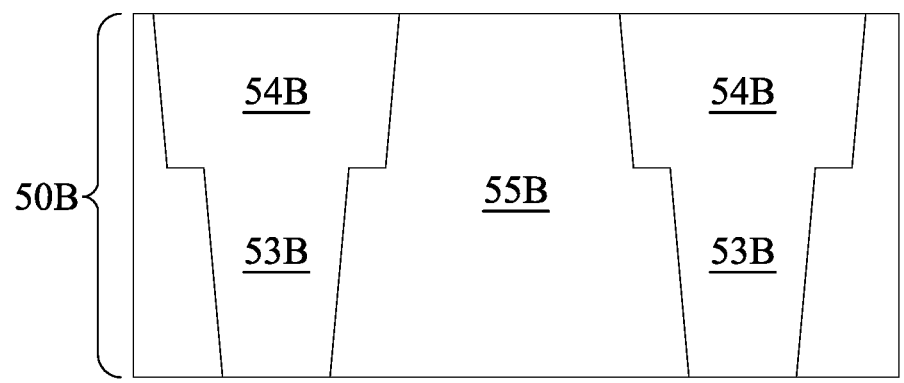

FIG. 6 illustrates an zoomed-in view of a region 501 of FIG. 5, showing an interconnect level 50B at an initial stage of fabrication of the SOT-MRAM cell. In FIG. 6, two separated and insulated conductive lines 54B at the interconnect level 50B have been illustrated as the conductive features to which the first and second ferromagnetic bottom electrodes of an SOT-MRAM cell will be electrically coupled at a subsequent processing step, in accordance with some embodiments. The conductive lines 54B are shown for illustrative purposes only; it is understood that the ferromagnetic bottom electrodes may be formed on conductive lines in any metallization layer suitable in a particular design. In FIG. 6, vias 53B and conductive lines 54B are shown embedded in an insulating film IMD 55B. The top dielectric surface of IMD 55B is shown to be substantially coplanar with the top conductive surfaces of conductive lines 54B, within process variations.

Figure 7:
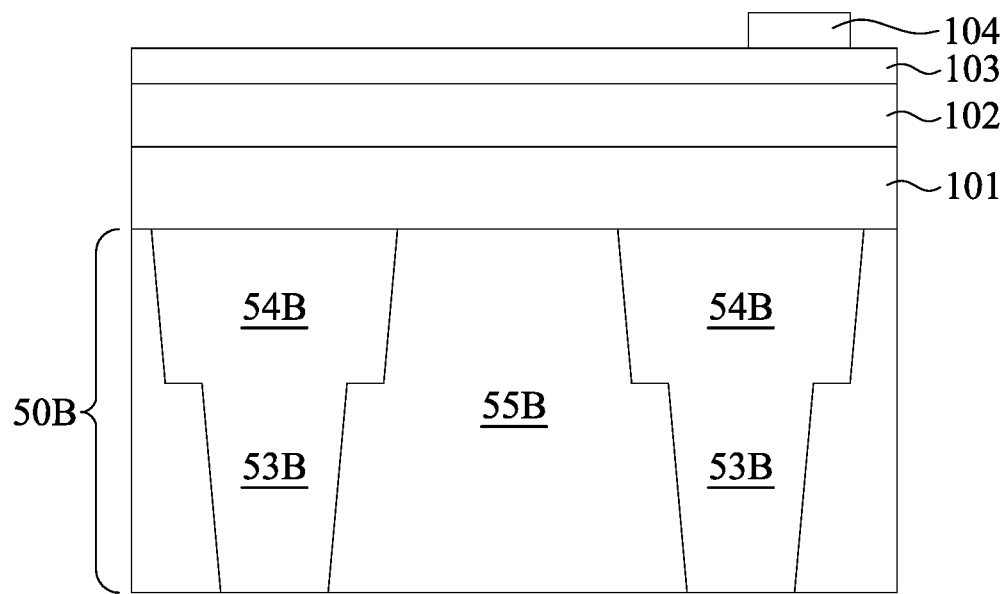

In FIG. 7, a first ferromagnetic layer 101 is formed over the interconnect level 50B in accordance with some embodiments. The first ferromagnetic layer 101 is a ferromagnet formed from a ferromagnetic material, such as Fe/Co-based alloy, CoFeB, CoFe, FeB, Fe, Co or other suitable ferromagnetic materials. The first ferromagnetic layer 101 has a thickness in a range, e.g., from about 0.1 nm to about 50 nm. The materials for first ferromagnetic layer 101 may be deposited using one or more techniques, such as CVD, PECVD, PVD, ALD, or PEALD, or the like, or a combination thereof.

FIG. 7 also illustrates a synthetic anti-ferromagnetic (SAF) spacer layer 102 formed over the first ferromagnetic layer 101. In some embodiments, the SAF spacer layer 102 may be formed of a non-magnetic material such as Ru, Ir or other suitable non-magnetic materials. The SAF spacer layer 102 has a thickness in a range, e.g., from about 10 nm to about 1 μm. The materials for SAF spacer layer 102 may be deposited using one or more techniques, such as CVD, PECVD, PVD, ALD, or PEALD, or the like, or a combination thereof.

FIG. 7 also illustrates a second ferromagnetic layer 103 formed over the SAF spacer layer 102. In some embodiments, the second ferromagnetic layer 103 is a ferromagnet formed from a ferromagnetic material, such as Fe/Co-based alloy, CoFeB, CoFe, FeB, Fe, Co or other suitable ferromagnetic materials. The second ferromagnetic layer 103 has a thickness in a range, e.g., from about 0.1 nm to about 50 nm. The materials for second ferromagnetic layer 103 may be deposited using one or more techniques, such as CVD, PECVD, PVD, ALD, or PEALD, or the like, or a combination thereof. In some embodiments, the first and second ferromagnetic layers 101 and 103 are formed from a same ferromagnetic material (e.g., cobalt). In some embodiments, the second ferromagnetic layer 103 has a thickness less than the thickness of the first ferromagnetic layer 101, which in turn allows for reversing the magnetization direction of the second ferromagnetic layer 103, as will be discussed in greater detail below.

FIG. 7 also illustrates a patterned mask 104 formed over the second ferromagnetic layer 103. In some embodiments, the patterned mask 104 is formed from metal, such as tantalum (Ta), titanium nitride (TiN) or other suitable metals. In some other embodiments, the patterned mask 104 is formed from a dielectric material, such as silicon nitride ($SiN_x$) or other suitable dielectric materials. The patterned mask 104 has a thickness in a range, e.g., from about 10 nm to about 500 nm. The patterned mask 104 may be formed by, for example, depositing a layer of mask material (e.g., silicon nitride) over the second ferromagnetic layer 103, coating a photoresist layer over the layer of mask material, patterning the photoresist layer into a photoresist mask by using a photolithography process, and etching the layer of mask material to form the patterned mask 104 by using the photoresist mask as an etch mask.

Figure 8:
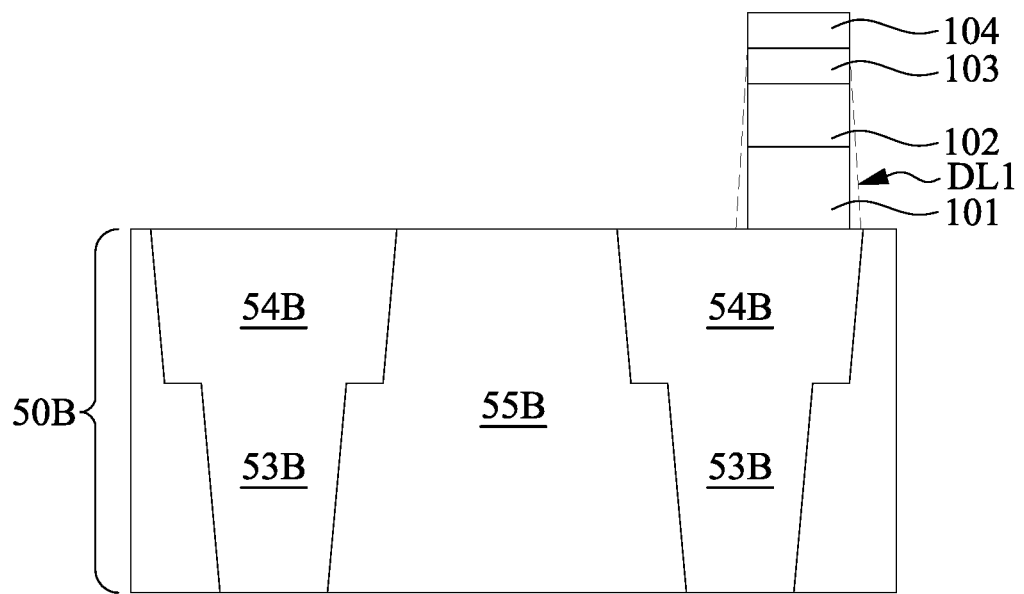

In FIG. 8, the first ferromagnetic layer 101, the SAF spacer layer 102, and the second ferromagnetic layer 103 are patterned to form a metal stack localized to a conductive line 54B by one or more etching steps by using the patterned mask 104 an etch mask. The one or more etching steps may include one or more dry etching steps, one or more wet etching steps, or combinations thereof, and may use one or more etchants that etch the first ferromagnetic layer 101, the SAF spacer layer 102, and the second ferromagnetic layer 103 at a faster etch rate than etching the patterned mask 104. Although the resultant first ferromagnetic layer 101, the SAF spacer layer 102, and the second ferromagnetic layer 103 have vertical sidewalls, the one or more etching steps may lead to tapered sidewalls in some other embodiments, as indicated by the dash line DL1 in FIG. 8. Due to the nature of anisotropic etching, the tapered sidewall may cause each of the first ferromagnetic layer 101, the SAF spacer layer 102, and the second ferromagnetic layer 103 has a width decreasing as a distance from the interconnect level 50B increases. In some embodiments, geometry of the resultant metal stack of the first ferromagnetic layer 101, the SAF spacer layer 102, and the second ferromagnetic layer 103 can be cylinder, rectangular, cuboid, thin-film-like, with or without rounded corners. In some embodiments, the lateral dimension (length, width or diameter) of the metal stack is in a range from about 0.1 nm to about 1 µm, and a height of the metal stack is in a range from about 0.1 nm to about 1 µm.

Figure 9:
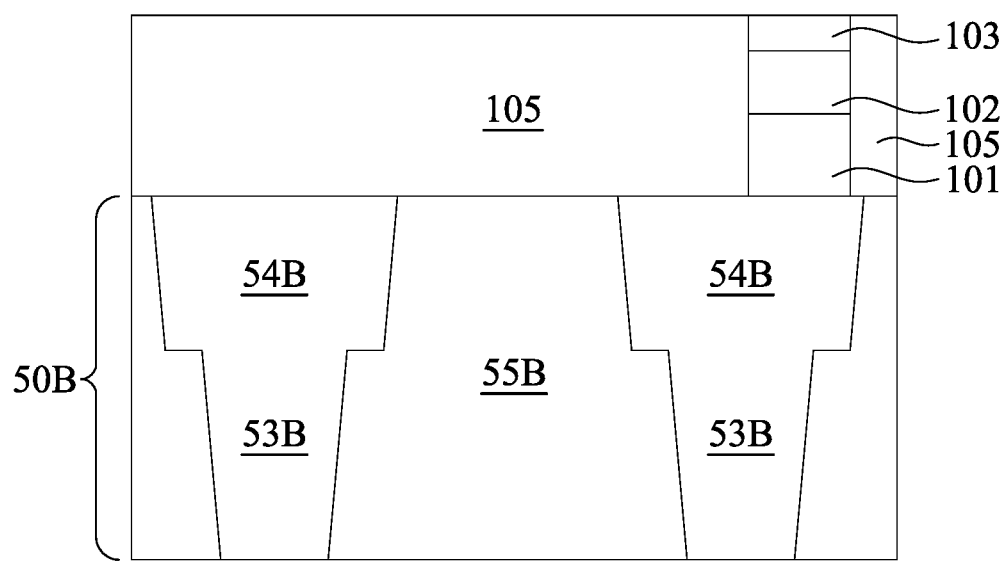

In FIG. 9, a dielectric layer 105 is deposited over the metal stack of the first ferromagnetic layer 101, the SAF spacer layer 102, and the second ferromagnetic layer 103, followed by a CMP process to remove excesses dielectric materials above the second ferromagnetic layer 103. In some embodiments, the CMP process also removes the patterned mask 104 from the second ferromagnetic layer 103. As a result, the CMP process makes the top surface of the second ferromagnetic layer 103 exposed and substantially coplanar with the top surface of the dielectric layer 105. In some embodiments, the dielectric layer 105 includes a low-k material same as or similar to that of the IMD 55B. For example, the dielectric layer 105 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. In some embodiments, the dielectric layer 105 has a thickness in a range from about 1 nm to about 1 µm.

Figure 10:
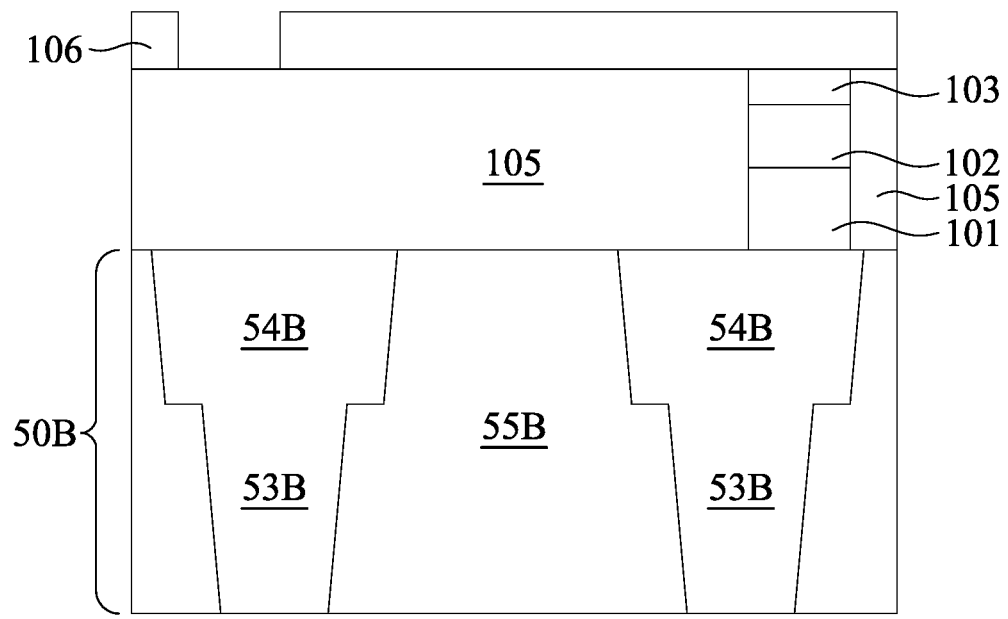

In FIG. 10, a patterned mask 106 is formed over the dielectric layer 105. In some embodiments, the patterned mask 106 is formed from metal, such as tantalum (Ta), titanium nitride (TiN) or other suitable metals. In some other embodiments, the patterned mask 106 is formed from a dielectric material, such as silicon nitride (SiN) or other suitable dielectric materials. The patterned mask 106 has a thickness in a range, e.g., from about 10 nm to about 500 nm. The patterned mask 106 may be formed by, for example, depositing a layer of mask material (e.g., silicon nitride) over the dielectric layer 105, coating a photoresist layer over the layer of mask material, patterning the photoresist layer into a photoresist mask by using a photolithography process, and etching the layer of mask material to form the patterned mask 106 by using the photoresist mask as an etch mask.

Figure 11:
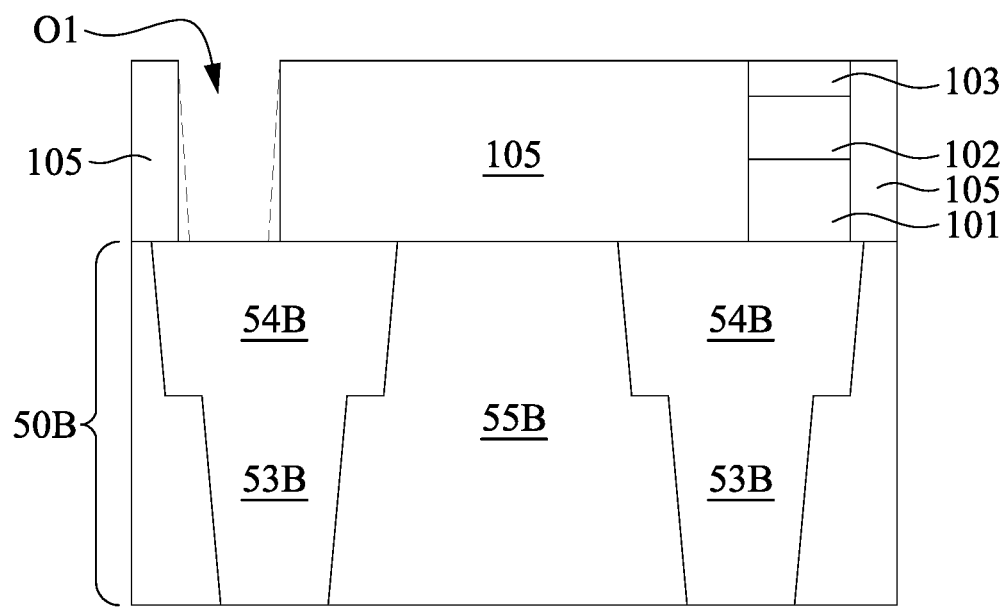

Afterwards, the dielectric layer 105 is etched using the patterned mask 106 as an etch mask to form an opening O1 in the dielectric layer 105. The resultant structure is shown in FIG. 11. The opening O1 extends through the dielectric layer 105 and terminates at a top surface of a metal line 54B in the underlying interconnect level 50B, and thus the metal line 54B is exposed at the bottom of the opening O1. The dielectric layer 105 can be etched by using dry etching, wet etching, or combinations thereof. In some embodiments, the dielectric layer 105 is etched using anisotropic etching, such as anisotropic dry etching. Although the resultant opening O1 has vertical sidewalls, the etching step may lead to tapered sidewalls in some other embodiments, as indicated by the dash line DL2 in FIG. 11. Thus, the opening O1 may have a width increasing as a distance from the underlying interconnect level 50B increases. In some embodiments, the opening O1 has a depth (corresponding to the height or thickness of the ferromagnetic electrode subsequently formed in the opening O1) in a range from about 0.1 nm to about In some embodiments, a lateral size (width, length or diameter) of the opening O1 is in a range from about 0.1 nm to about In some embodiments, the geometry of the opening O1 can be cylinder, rectangular, cuboid, thin-film-like, with or without rounded corners.

Figure 12:
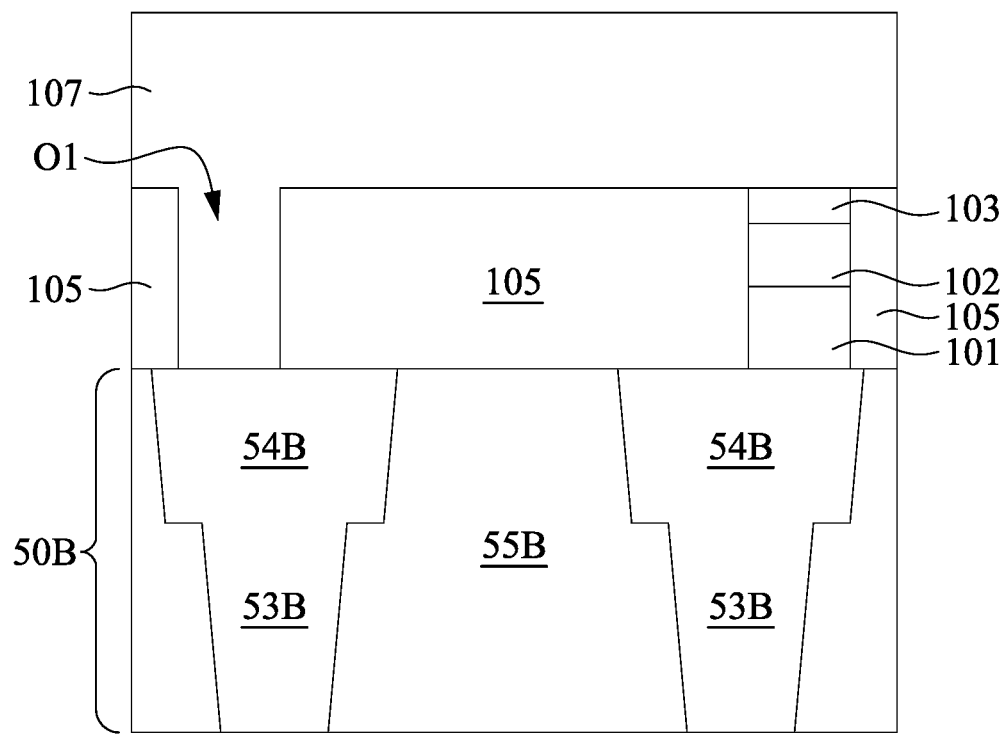

In FIG. 12, a third ferromagnetic layer 107 is deposited in the opening O1 of the dielectric layer 105 until the opening O1 is overfilled. The third ferromagnetic layer 107 is a ferromagnet formed from a ferromagnetic material, such as Fe/Co-based alloy, CoFeB, CoFe, FeB, Fe, Co, or other suitable ferromagnetic materials. The third ferromagnetic layer 107 has a thickness in a range, e.g., from about 0.1 nm to about 50 nm. The materials for third ferromagnetic layer 107 may be deposited using one or more techniques, such as CVD, PECVD, PVD, ALD, or PEALD, or the like, or a combination thereof. In some embodiments, the third ferromagnetic layer 107 is formed from a same ferromagnetic material (e.g., cobalt) as the first and second ferromagnetic layers 101, 103.

Figure 13:
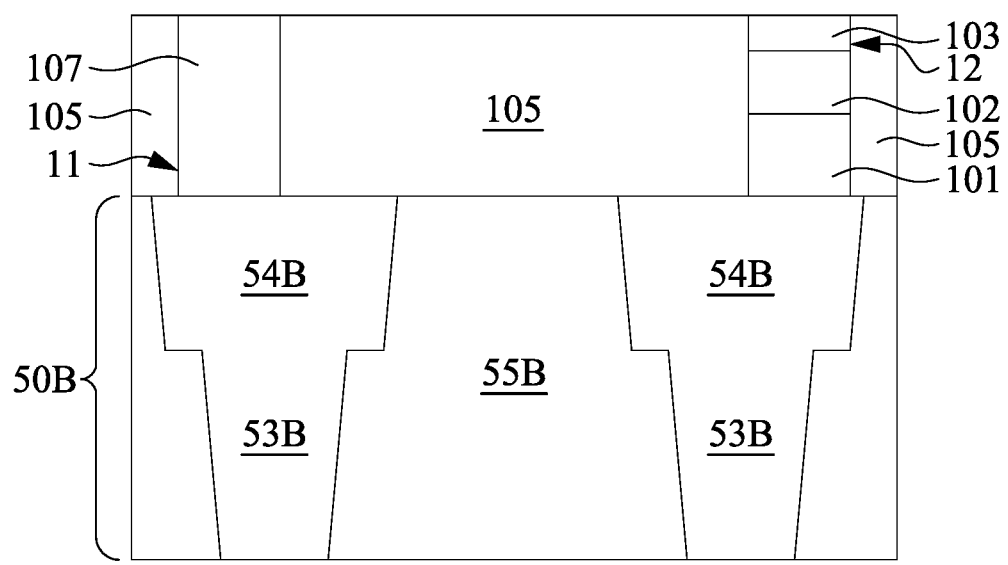

In FIG. 13, a CMP process and/or an etch back process is performed on the third ferromagnetic layer 107 until the dielectric layer 105 and the second ferromagnetic layer 103 are exposed, leaving a portion of the third ferromagnetic layer 107 in the opening O1 in the dielectric layer 105 to serve as a first ferromagnetic bottom electrode 11. In some embodiments, the CMP process results in a top surface of the first ferromagnetic bottom electrode 11 substantially coplanar with a top surface of the dielectric layer 105 and a top surface of the second ferromagnetic layer 103.

An external magnetic field is applied to the first, second, and third ferromagnetic layers 101, 103, and 107 to set their magnetization directions. Because the first, second, and third ferromagnetic layers 101, 103, and 107 are applied with a same magnetic field, they have a same first magnetization direction during applying the external magnetic field. After stopping applying the external magnetic field, the magnetization direction of the second ferromagnetic layer 103 will be spontaneously reversed to a second magnetization direction opposite the first magnetization direction, because the SAF spacer 102 is sandwiched between the first and second ferromagnetic layers 101, 103 and the second ferromagnetic layer 103 is thinner than the first ferromagnetic layer 101. As a result, the magnetization directions of the second ferromagnetic layer 103 and the third ferromagnetic layer 107 become in anti-parallel orientation, and the second ferromagnetic layer 103 can serve as a second ferromagnetic bottom electrode 12. In some embodiments, the external magnetic field is applied before or after the CMP process. In some embodiments, after stopping applying the external magnetic field, the magnetization direction of the first ferromagnetic layer 101 will not be reversed, because it is thicker than the second ferromagnetic layer 103. As a result, the magnetization direction of the first ferromagnetic layer 101 is in anti-parallel orientation with the magnetization direction of the second ferromagnetic layer 103, and in parallel orientation with the magnetization direction of the third ferromagnetic layer 107.

Figure 14:
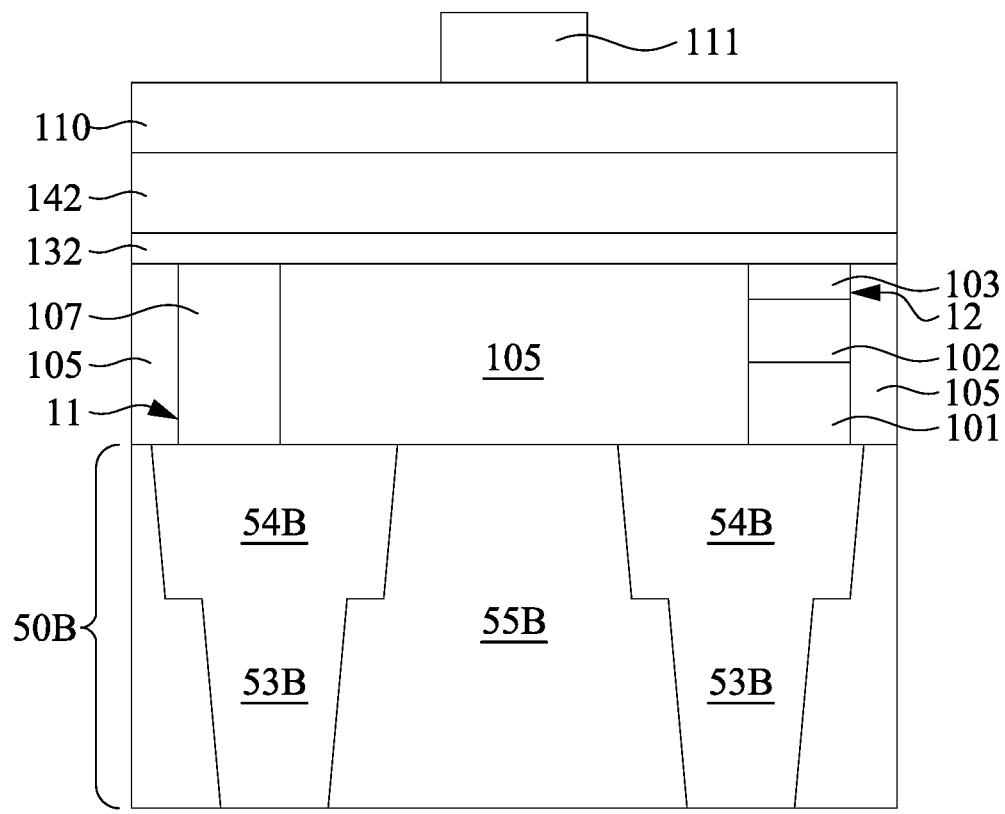

In FIG. 14, a SOT channel layer 132 is globally formed over the dielectric layer 105 and the first and second ferromagnetic electrodes 11 and 12. The SOT channel layer 13 includes non-magnetic heavy metal material, such as tungsten (W), tantalum (Ta) or the like, and has a thickness in a range from about 0.1 nm to about 50 nm. The material for SOT channel layer 13 may be deposited using one or more techniques, such as CVD, PECVD, PVD, ALD, or PEALD, or the like, or a combination thereof.

FIG. 14 also illustrates an MTJ layer stack 142 formed over the SOT channel layer 132. In some embodiments, the MTJ layer stack 142 includes, as illustrated in FIG. 1, a free layer 118, a tunnel barrier layer 117 formed over the free layer 118, a reference layer 116 formed over the tunnel barrier layer 117, a metal spacer layer 115 formed over the reference layer 116, a first ferromagnetic multilayer film 114 formed over the metal spacer layer 115, a non-magnetic spacer layer 113 formed over the first ferromagnetic multilayer film 114, and a second ferromagnetic multilayer film 112. Each layer in the MTJ layer stack 142 can be deposited using one or more techniques, such as CVD, PECVD, PVD, ALD, or PEALD, or the like, or a combination thereof. Other details about these layers are discussed previously with respect to FIG. 1, and thus they are not repeated for the sake of brevity.

Figure 15:
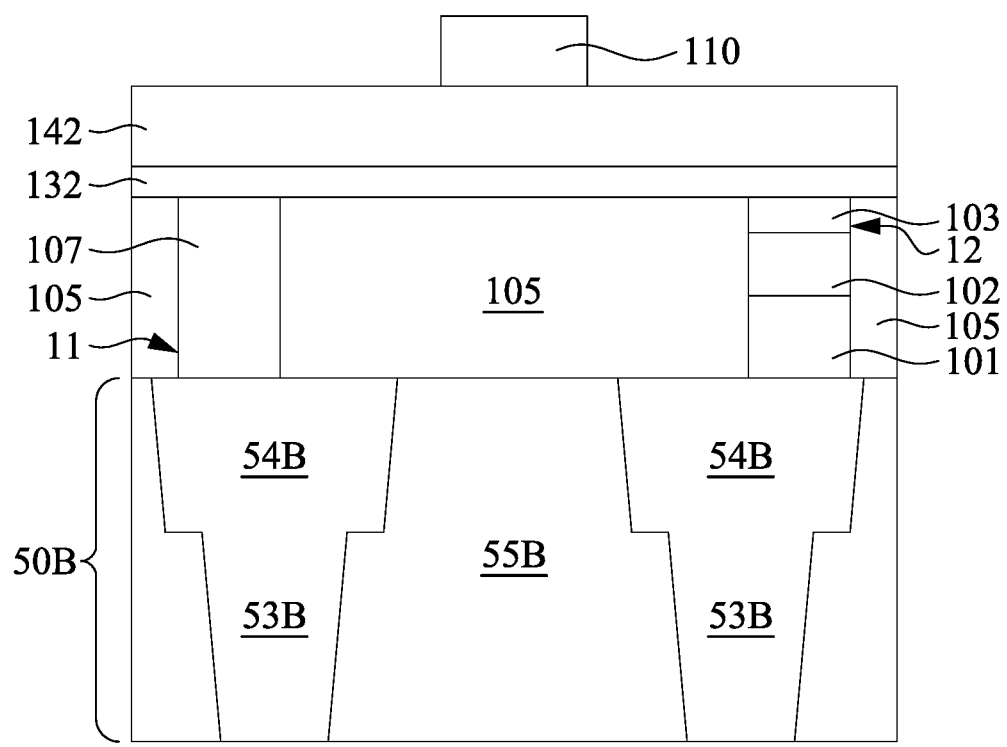

FIG. 14 also illustrates a mask layer 110 deposited over the MTJ layer stack 142. In some embodiments, the mask layer 110 is formed from metal, such as tantalum (Ta), titanium nitride (TiN) or other suitable metals. The mask layer 110 has a thickness in a range, e.g., from about 10 nm to about 500 nm. FIG. 15 also illustrates a patterned mask 111 formed over the mask layer 110. In some embodiments, the patterned mask 111 is a patterned photoresist formed using suitable photolithography process.

In an example photolithography process, photoresist material is irradiated (exposed) and developed to remove portions of the photoresist material. In greater detail, a photomask or reticle (not shown) may be placed above the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist material. A developer may be used to remove either the exposed or unexposed portions of the photoresist material depending on whether a positive or negative resist is used, leaving a patterned photoresist mask 111 over the mask layer 110.

In FIG. 15, the mask layer 110 is patterned using the patterned mask 111 as an etch mask. The mask layer 110 can be patterned by using suitable etching techniques, such as wet etching, dry etching, or combinations thereof. After patterning the mask layer 110, the patterned photoresist layer 111 can be removed, for example, using a plasma ash process. In some embodiments, a plasma ash process is performed such that the temperature of the photoresist is increased until the photoresist experiences a thermal decomposition and may be removed. However, any other suitable process, such as a wet strip, may be utilized.

Figure 16:
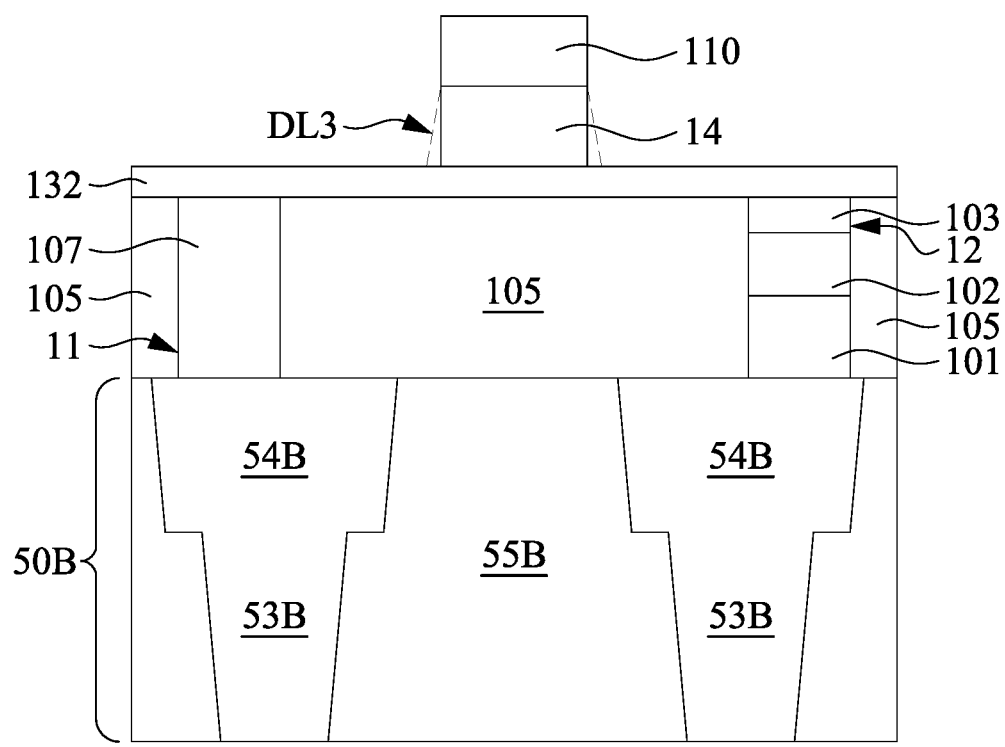

Afterwards, the MTJ layer stack 142 is patterned into a MTJ cell 14 positioned laterally between the first ferromagnetic bottom electrode 11 and the second ferromagnetic bottom electrode 12. The resultant structure is illustrated in FIG. 16. The patterning can be performed by one or more etching steps using the mask layer 110 as an etch mask. In some embodiments, the MTJ layer stack 142 is patterned using anisotropic etching, such as anisotropic dry etching. Although the resultant MTJ cell 14 has vertical sidewalls, the etching step may lead to tapered sidewalls in some other embodiments, as illustrated by the dash line DL3 in FIG. 16. Thus, the MTJ cell 14 may have a width decreasing as a distance from the underlying interconnect level 50B increases. In some embodiments, an easy magnetization axis of the MTJ cell 14 is in-plane or perpendicular. In some embodiments, the top-view geometry profile of the MTJ cell 14 can be circular, elliptical, rectangular, square, with or without rounded corners. In some embodiments, the MTJ cell 14 has a junction size in a range from about 1 nm to about 1 µm.

Figure 17:
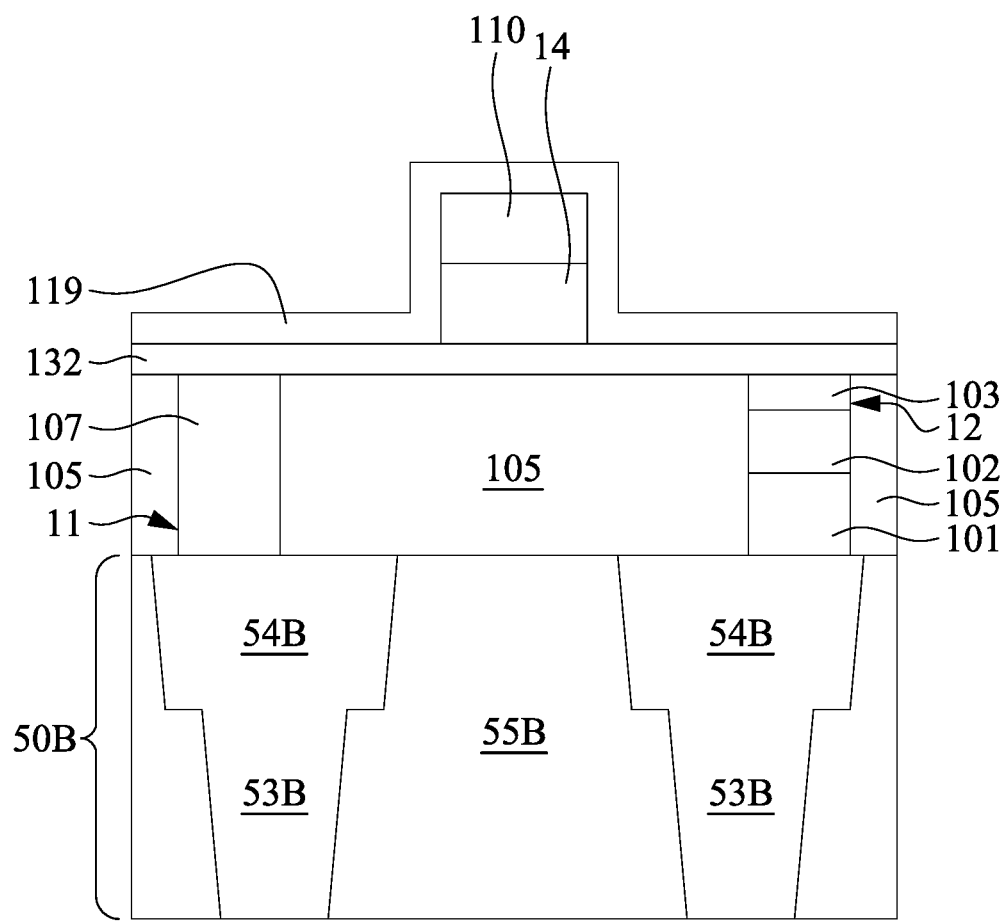

In FIG. 17, a passivation layer 119 is conformally formed over the MTJ cell 14 and the SOT channel layer 132. In some embodiments, the passivation layer 119 includes silicon nitride or other suitable dielectric materials and has a thickness in a range from about 1 nm to about 50 nm. The passivation layer 119 can be formed using suitable deposition techniques, such as CVD, PECVD, ALD, or the like.

Figure 18:
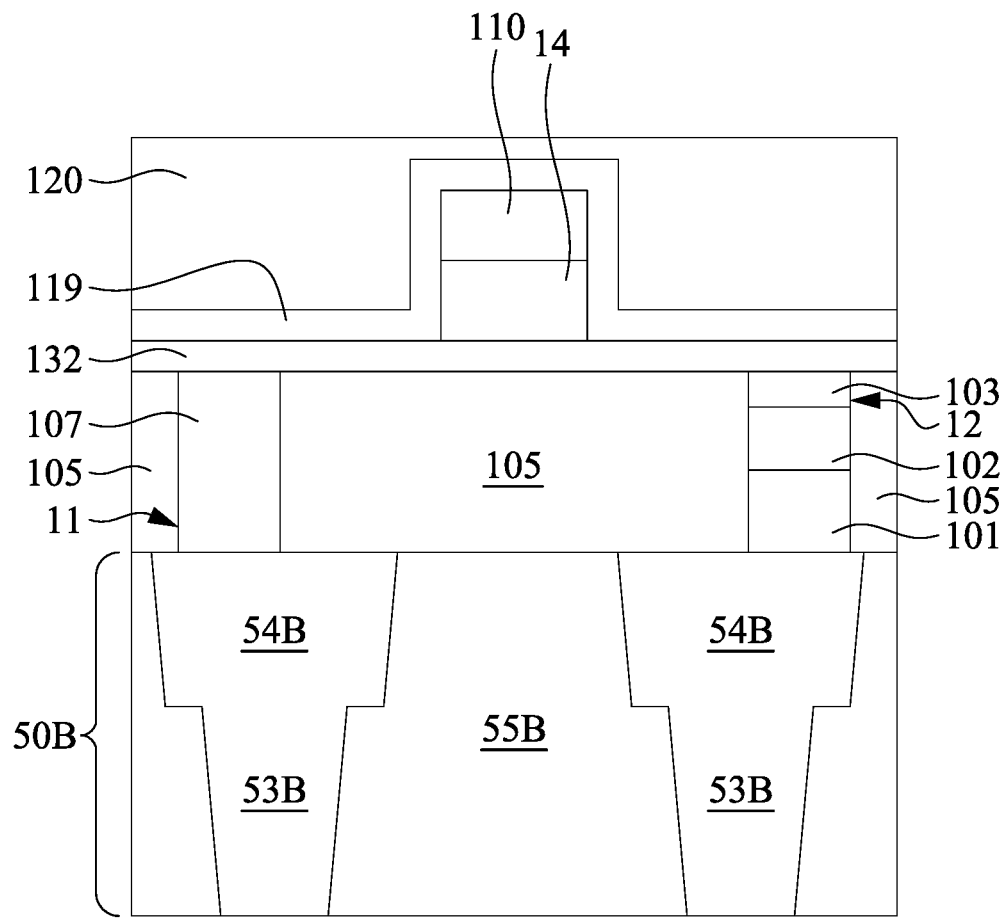

In FIG. 18, a dielectric layer 120 is deposited over the passivation layer 119. Top surface of the dielectric layer 120 may be optionally planarized by using a CMP process. In some embodiments, the dielectric layer 120 includes a low-k material same as or similar to that of the IMD 55B and the dielectric layer 105. For example, the dielectric layer 120 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. In some embodiments, the dielectric layer 120 has a thickness in a range from about 1 nm to about 500 nm.

Figure 19:
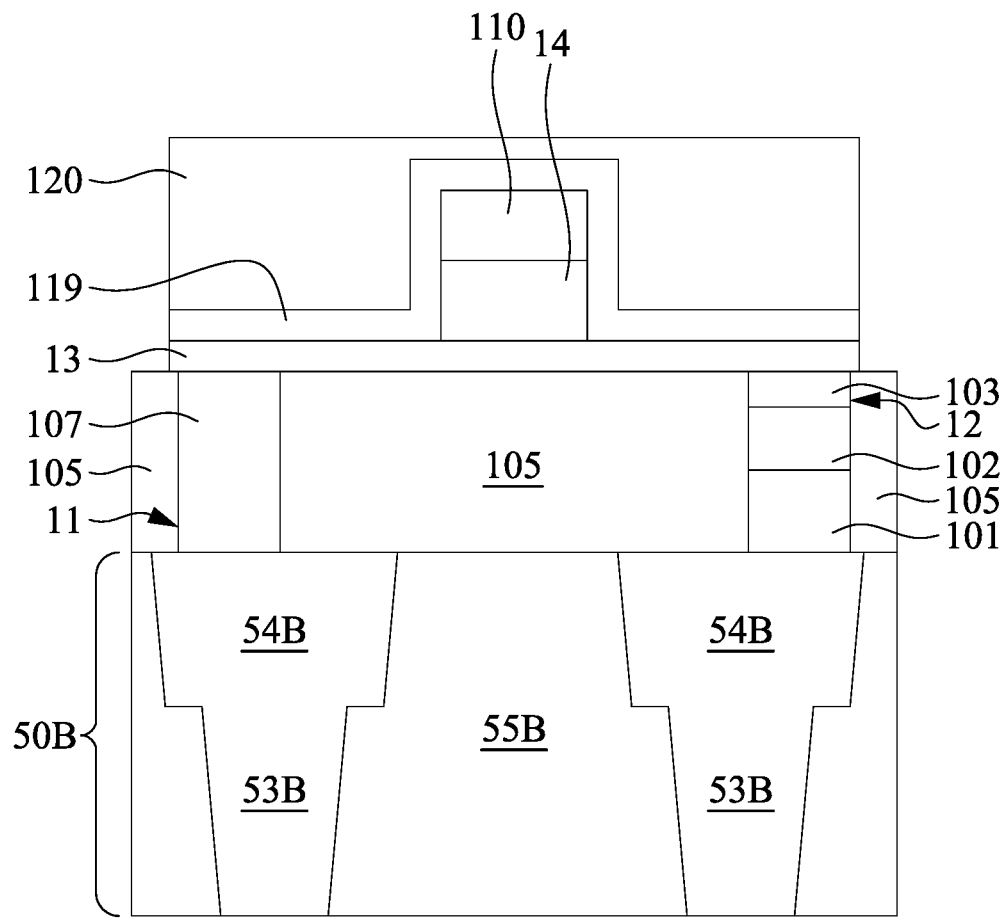

In FIG. 19, the dielectric layer 120, the passivation layer 119, and the SOT channel layer 132 are patterned by using suitable photolithography and etching techniques. The global SOT channel layer 132 is thus patterned in to a patterned SOT channel layer 13 localized to a region spanning only two ferromagnetic electrodes, i.e., the first and second ferromagnetic electrodes 11 and 12, which in turn allows a charge current flowing from one of the ferromagnetic electrodes 11 and 12 to another one of the ferromagnetic electrodes 11 and 12 through the SOT channel layer 13.

Figure 20:
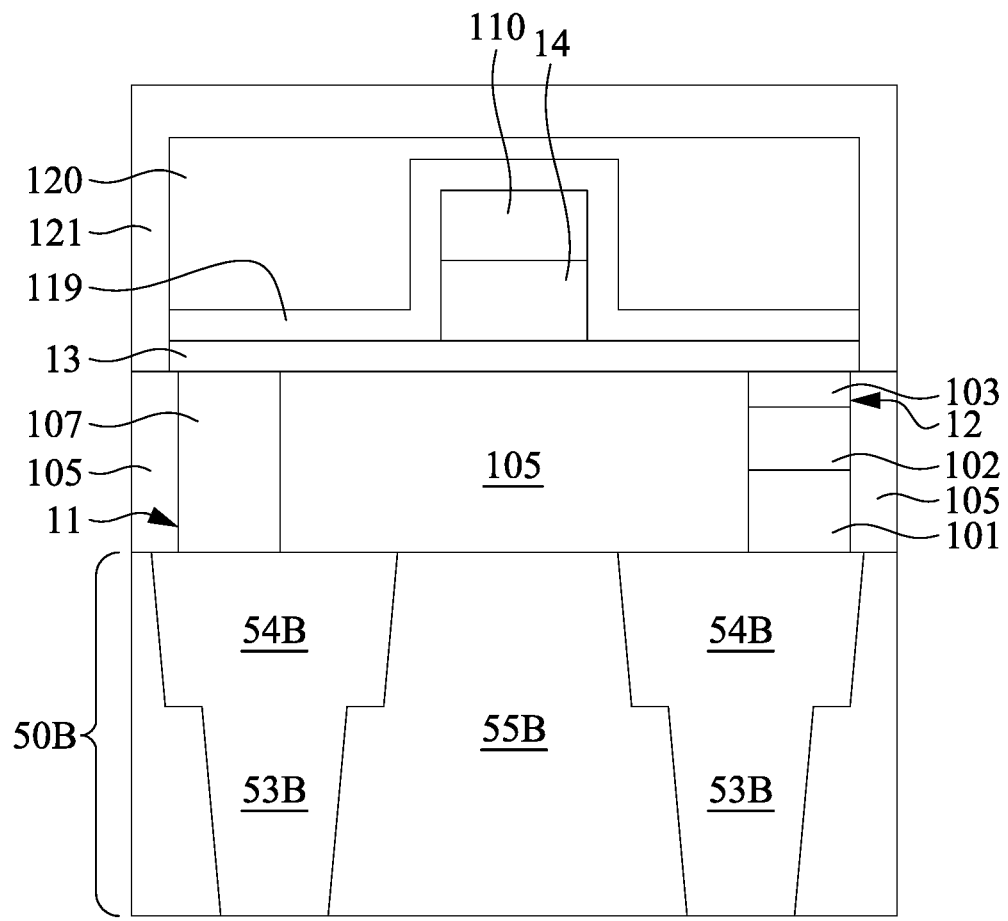

In FIG. 20, another dielectric layer 121 is deposited over the dielectric layer 120. Top surface of the dielectric layer 121 may be optionally planarized by using a CMP process. In some embodiments, the dielectric layer 121 includes a low-k material same as or similar to that of the IMD 55B, the dielectric layer 105, and the dielectric layer 120. For example, the dielectric layer 120 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. In some embodiments, the dielectric layer 120 has a thickness in a range from about 1 nm to about 500 nm.

Figure 21:
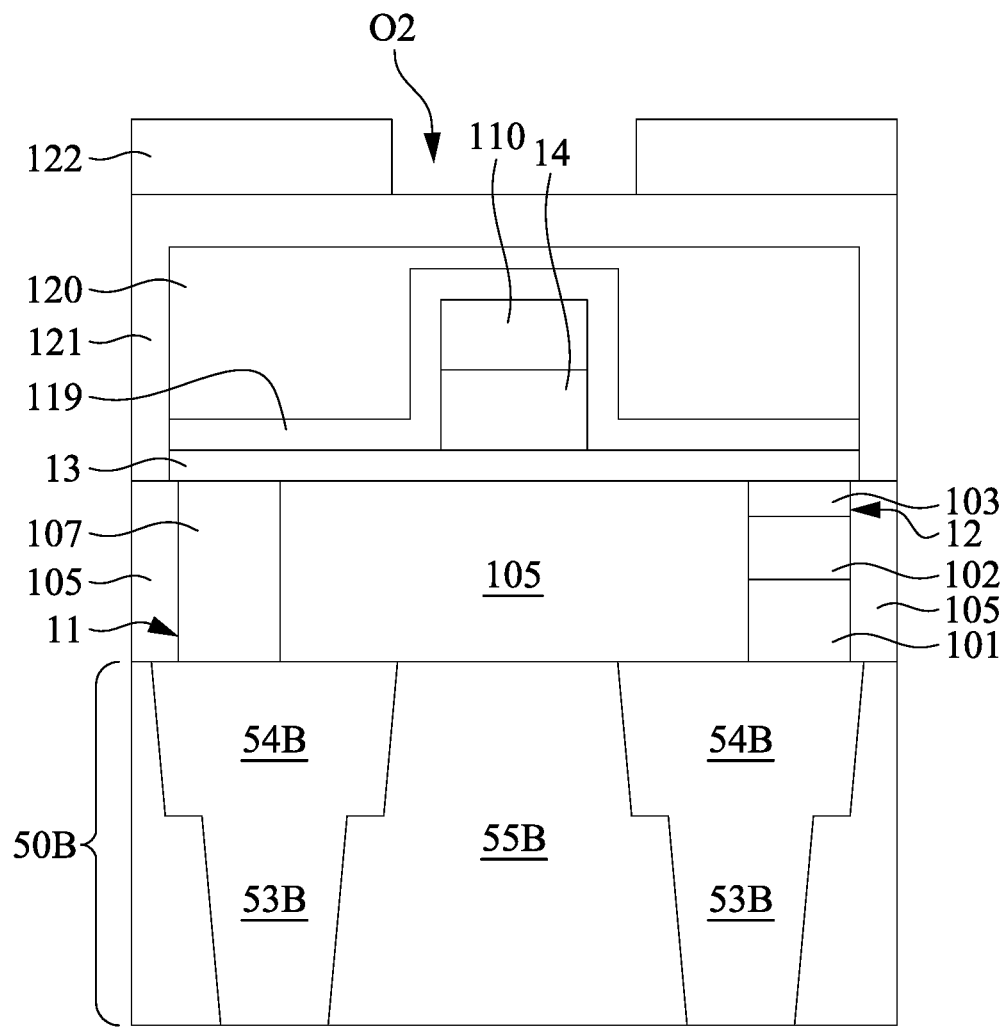

In FIG. 21, a patterned mask 122 is formed over the dielectric layer 121. In some embodiments, the patterned mask 122 is a patterned photoresist formed using suitable photolithography process, as discussed previously with respect to the patterned photoresist 111. The patterned mask 122 has an opening O2 directly above the MTJ cell 14. The opening O2 has a wider width (or diameter, if being circular) than the underlying patterned mask layer 110 and the MTJ cell 14.

Figure 22:
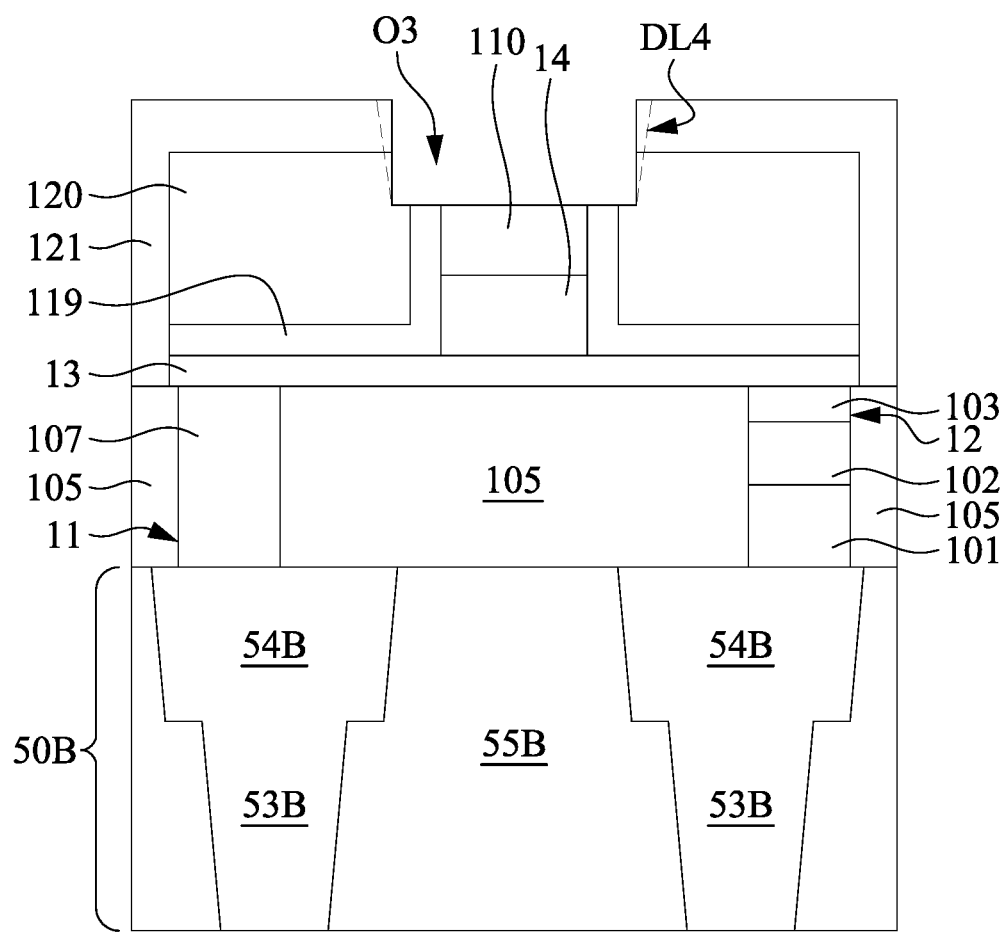

In FIG. 22, the dielectric layers 120 and 121 are etched by using the patterned mask 122 as an etch mask, resulting in an opening O3 that exposes the patterned mask layer 110. The opening O3 has a wider width (or diameter, if being circular) than the underlying patterned mask layer 110 and the MTJ cell 14. The etching step may include dry etching, wet etching, or combinations thereof. Although in the illustrated embodiment in FIG. 22 the opening O3 has vertical sidewalls, the etching step may lead to tapered sidewalls in some other embodiments, as illustrated in the dash line DL4 in FIG. 22. Thus, the opening O4 may have a width (or diameter, if being circular) increasing as a distance from the underlying interconnect level 50B increases.

Figure 23:
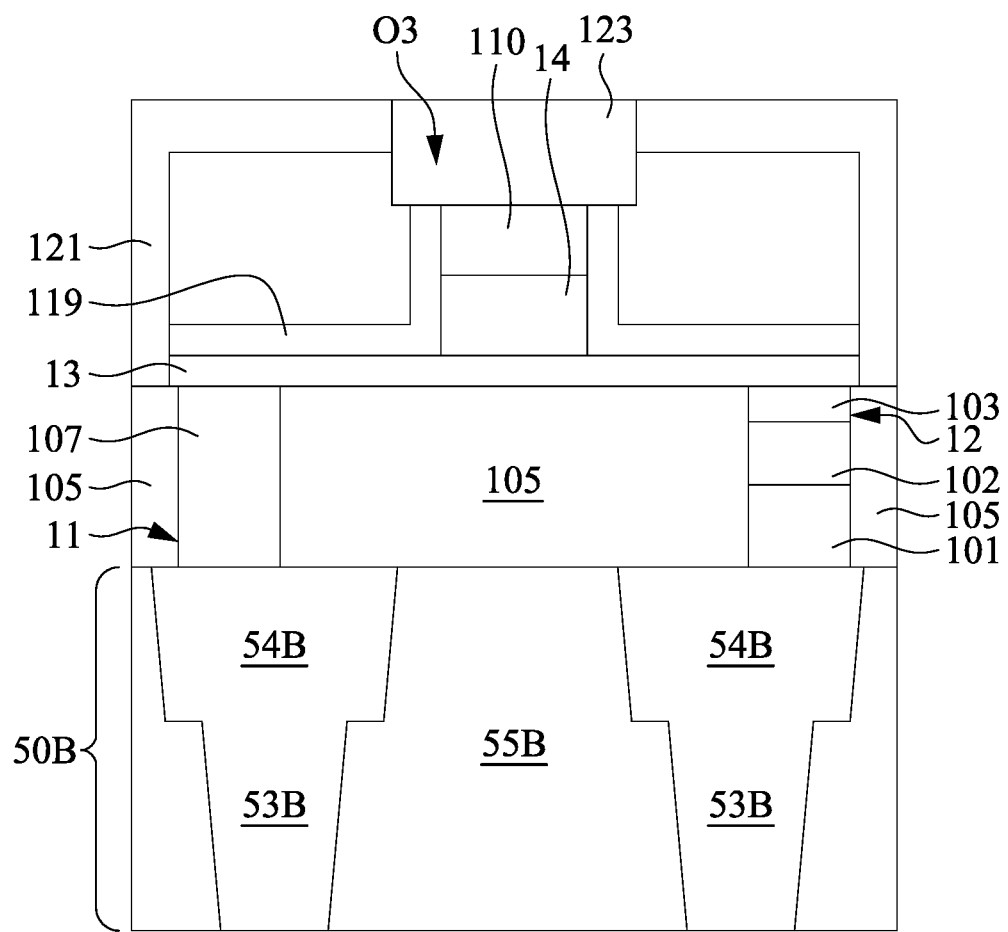

In FIG. 23, conductive feature 123 is formed in the opening O3. The conductive feature 123 is a metal line or metal via in contact with the patterned mask layer 110. Because the patterned mask layer 110 is metal, it can serve as a top electrode electrically coupling the underlying MTJ cell 14 to the overlying conductive feature 123. In some embodiments, the conductive feature 123 includes Cu, Al, W, Co, Ru, or the like, or combinations thereof, or multilayers thereof. The conductive feature 123 can be formed by, for example, depositing one or more metals in the opening O3, followed by a CMP process that removes excessive portions of the one or more metals outside the opening O3.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that ferromagnetic bottom electrodes allow for more electrons can be accumulated at a boundary between the SOT channel layer and the free layer of the MTJ structure, which in turn results in a stronger magnetic torque and hence improves the SOT efficiency. Another advantage is that the write current flowing either in the first in-plane direction or the second in-plane direction results in more electrons accumulated on the top surface of the SOT channel layer than on the bottom surface of the SOT channel layer, because of the first and second ferromagnetic bottom electrodes have antiparallel magnetization directions.

In some embodiments, a method comprises forming a first ferromagnetic bottom electrode over a first conductive feature of an interconnect structure; forming a second ferromagnetic bottom electrode over a second conductive feature of the interconnect structure; forming an spin-orbit torque (SOT) channel layer extending across the first ferromagnetic bottom electrode and the second ferromagnetic bottom electrode; and forming a magnetic tunnel junction (MTJ) cell over the SOT channel layer.

In some embodiments, a method comprises depositing in sequence a first ferromagnetic layer, a non-magnetic layer, and a second ferromagnetic layer over a substrate; patterning the first ferromagnetic layer, the non-magnetic layer, and the second ferromagnetic layer into a metal stack comprising a portion of the first ferromagnetic layer, a portion of the non-magnetic layer, and a portion of the second ferromagnetic layer; forming a dielectric layer laterally surrounding the metal stack; etching an opening in the dielectric layer; depositing a third ferromagnetic layer in the opening in the dielectric layer; forming a heavy metal layer over the metal stack and the third ferromagnetic layer; and forming an MTJ structure over the heavy metal layer.

In some embodiments, a memory structure comprises a dielectric layer, a first ferromagnetic bottom electrode, a second ferromagnetic bottom electrode, an SOT channel layer, and an MTJ structure. The dielectric layer is over the substrate. The first ferromagnetic bottom electrode extends through the dielectric layer. The second ferromagnetic bottom electrode extends through the dielectric layer, and is spaced apart from the first ferromagnetic bottom electrode. The SOT channel layer extends from the first ferromagnetic bottom electrode to the second ferromagnetic bottom electrode. The MTJ structure is over the SOT channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first ferromagnetic bottom electrode over a first conductive feature of an interconnect structure, comprising forming a first ferromagnetic layer over the first conductive feature, forming a synthetic anti-ferromagnetic (SAF) spacer layer over the first ferromagnetic layer, and forming a second ferromagnetic layer over the SAF spacer layer to serve as the first ferromagnetic bottom electrode, wherein the first ferromagnetic layer has a thickness greater than a thickness of the second ferromagnetic layer;
    forming a second ferromagnetic bottom electrode over a second conductive feature of the interconnect structure;
    forming an spin-orbit torque (SOT) channel layer extending across the first ferromagnetic bottom electrode and the second ferromagnetic bottom electrode; and
    forming a magnetic tunnel junction (MTJ) cell over the SOT channel layer.

2. The method of claim 1, wherein the first ferromagnetic bottom electrode and the second ferromagnetic bottom electrode have anti-parallel magnetization directions.

3. The method of claim 1, further comprising:
    applying an external magnetic field to make the first ferromagnetic bottom electrode and the second ferromagnetic bottom electrode have a first magnetization direction; and
    stopping the external magnetic field such that the first magnetization direction of the first ferromagnetic bottom electrode changes to a second magnetization direction opposite the first magnetization direction.

4. The method of claim 1, wherein forming the first ferromagnetic bottom electrode further comprises:
    etching the second ferromagnetic layer, the SAF spacer layer, and the first ferromagnetic layer to form a metal stack localized to the first conductive feature.

5. The method of claim 1, wherein the second ferromagnetic bottom electrode is formed after forming the first ferromagnetic bottom electrode.

6. The method of claim 1, further comprising:
depositing a dielectric layer over the first ferromagnetic bottom electrode;
performing a first chemical mechanical polish (CMP) process on the dielectric layer until the first ferromagnetic bottom electrode is exposed; and
etching an opening in the dielectric layer, wherein the second ferromagnetic bottom electrode is formed in the opening.

7. The method of claim 6, wherein forming the second ferromagnetic bottom electrode comprises:
depositing a ferromagnetic material in the opening in the dielectric layer; and
performing a second CMP process on the ferromagnetic material until the dielectric layer is exposed.

8. The method of claim 7, wherein after the second CMP process is complete, the first ferromagnetic bottom electrode is exposed.

9. A method comprising:
depositing in sequence a first ferromagnetic layer, a non-magnetic layer, and a second ferromagnetic layer over a substrate;
patterning the first ferromagnetic layer, the non-magnetic layer, and the second ferromagnetic layer into a metal stack comprising a portion of the first ferromagnetic layer, a portion of the non-magnetic layer, and a portion of the second ferromagnetic layer;
forming a dielectric layer laterally surrounding the metal stack;
etching an opening in the dielectric layer;
depositing a third ferromagnetic layer in the opening in the dielectric layer;
forming a heavy metal layer over the metal stack and the third ferromagnetic layer; and
forming an MTJ structure over the heavy metal layer.

10. The method of claim 9, wherein the third ferromagnetic layer is further deposited on the metal stack, and the method further comprises:
performing a CMP process to remove the third ferromagnetic layer from a top surface of the metal stack.

11. The method of claim 9, wherein the third ferromagnetic layer has a thickness greater than a thickness of the first ferromagnetic layer.

12. The method of claim 9, wherein the third ferromagnetic layer has a thickness greater than a thickness of the second ferromagnetic layer.

13. The method of claim 9, wherein forming the dielectric layer comprises:
depositing the dielectric layer over the metal stack; and
performing a CMP process on the dielectric layer to expose the metal stack.

14. A method comprising:
forming a dielectric layer over a substrate;
forming a first ferromagnetic bottom electrode extending through the dielectric layer;
forming a second ferromagnetic bottom electrode extending through the dielectric layer, and spaced apart from the first ferromagnetic bottom electrode, wherein the second ferromagnetic bottom electrode has a thickness different from a thickness of the first ferromagnetic bottom electrode;
forming an SOT channel layer extending from the first ferromagnetic bottom electrode to the second ferromagnetic bottom electrode; and
forming an MTJ structure over the SOT channel layer.

15. The method of claim 14, wherein the first ferromagnetic bottom electrode and the second ferromagnetic bottom electrode are magnetically oriented in opposite directions.

16. The method of claim 14, wherein the first ferromagnetic bottom electrode has a bottom surface lower than a bottom surface of the second ferromagnetic bottom electrode.

17. The method of claim 14, further comprising:
forming a metal spacer layer under the second ferromagnetic bottom electrode; and
forming a ferromagnetic layer under the metal spacer layer.

18. The method of claim 14, further comprising:
forming a passivation layer on a sidewall of the MTJ structure;
forming a top electrode on a top surface of the MTJ structure; and
forming a metal line or via over the top electrode.

19. The method of claim 16, wherein the first ferromagnetic bottom electrode has a top surface level with a top surface of the second ferromagnetic bottom electrode.

20. The method of claim 17, wherein the ferromagnetic layer has a thickness greater than the thickness of the second ferromagnetic bottom electrode.

* * * * *